United States Patent
Amada et al.

[19]

[11] Patent Number: 5,677,986
[45] Date of Patent: Oct. 14, 1997

[54] VECTOR QUANTIZING APPARATUS

[75] Inventors: Tadashi Amada; Kimio Miseki, both of Kawasaki; Masami Akamine, Yokosuka; Masahiro Oshikiri, Urayasu, all of Japan

[73] Assignee: Kabushiki Kaisha Toshiba, Kawasaki, Japan

[21] Appl. No.: 451,174

[22] Filed: May 26, 1995

[30] Foreign Application Priority Data

May 27, 1994 [JP] Japan .................................. 6-115465
Oct. 31, 1994 [JP] Japan .................................. 6-267828

[51] Int. Cl.$^6$ ........................................................ G10L 7/02
[52] U.S. Cl. ................................................ 395/2.31; 348/422
[58] Field of Search ........................... 395/2.1, 2.28, 395/2.3, 2.31, 2.38, 2.91, 2.92, 2.71; 375/240; 348/417, 418, 422

[56] References Cited

U.S. PATENT DOCUMENTS

| | | | |
|---|---|---|---|
| 4,817,157 | 3/1989 | Gerson | 395/2.31 |
| 4,878,230 | 10/1989 | Murakami et al. | 375/241 |
| 5,007,092 | 4/1991 | Galand et al. | 395/2.31 |
| 5,086,439 | 2/1992 | Asai et al. | 348/418 |
| 5,140,638 | 8/1992 | Moulsley et al. | 395/2.38 |
| 5,524,170 | 6/1996 | Matsuo et al. | 395/2.31 |

FOREIGN PATENT DOCUMENTS

WO 91/01545  2/1991  WIPO.

OTHER PUBLICATIONS

Ira A. Gerson, et al., "Vector Sum Excited Linear Prediction (VSELP) Speech Coding at 8 KBPS", Proc. IEEE Int. Conf. on Acoustics, Speech and Signal Processing, pp. 461–464, 1990.

*Primary Examiner*—Benedict V. Safourek
*Attorney, Agent, or Firm*—Oblon, Spivak, McClelland, Maier & Neustadt, P.C.

[57] ABSTRACT

A vector quantizing apparatus includes a first search section for obtaining an approximate vector X1 which is approximated to a desired vector R, a residual vector calculator for calculating a residual vector Rv from the desired vector R and the approximate vector X1, a weighting section for obtaining weighted vectors X2 to XN of code vectors x2 to xN, and a second search section for calculating an estimation value which is the magnitude of a projection vector of the residual vector Rv with respect to the vector space formed by the approximate vector X1 and the weighted vectors X2 to XN, and searching a code vector which maximizes this estimation value.

31 Claims, 25 Drawing Sheets

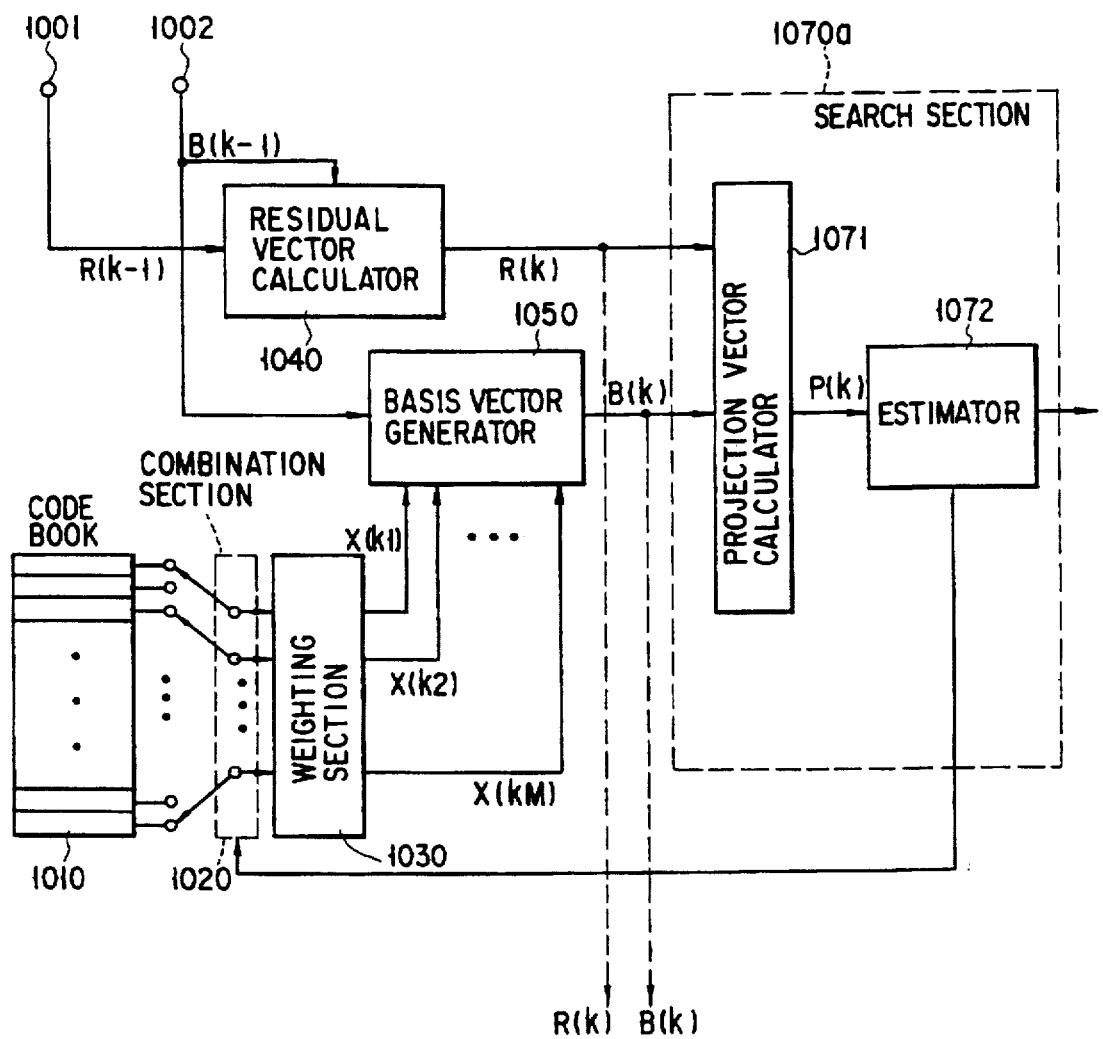
F I G. 1

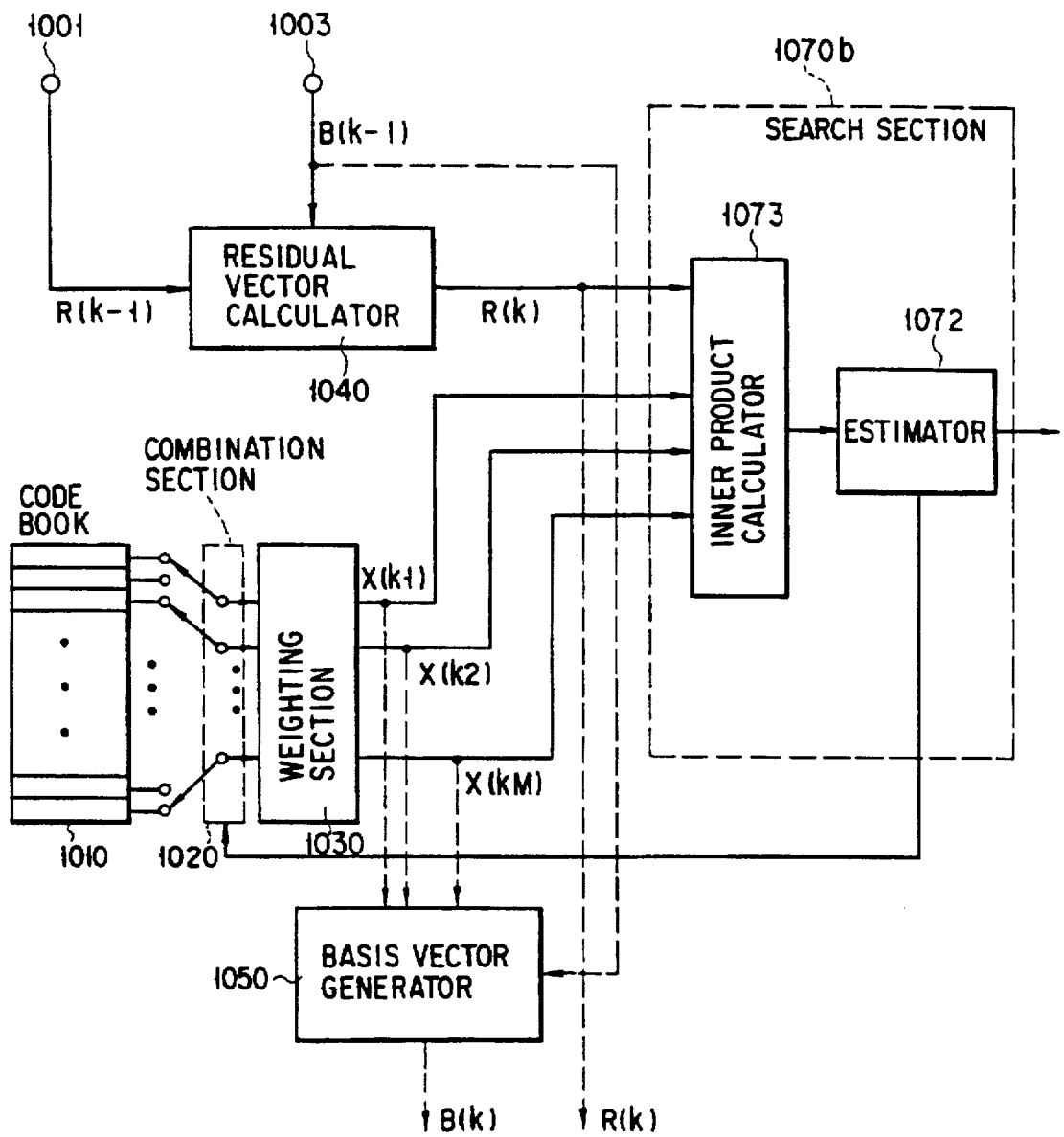
F I G. 2

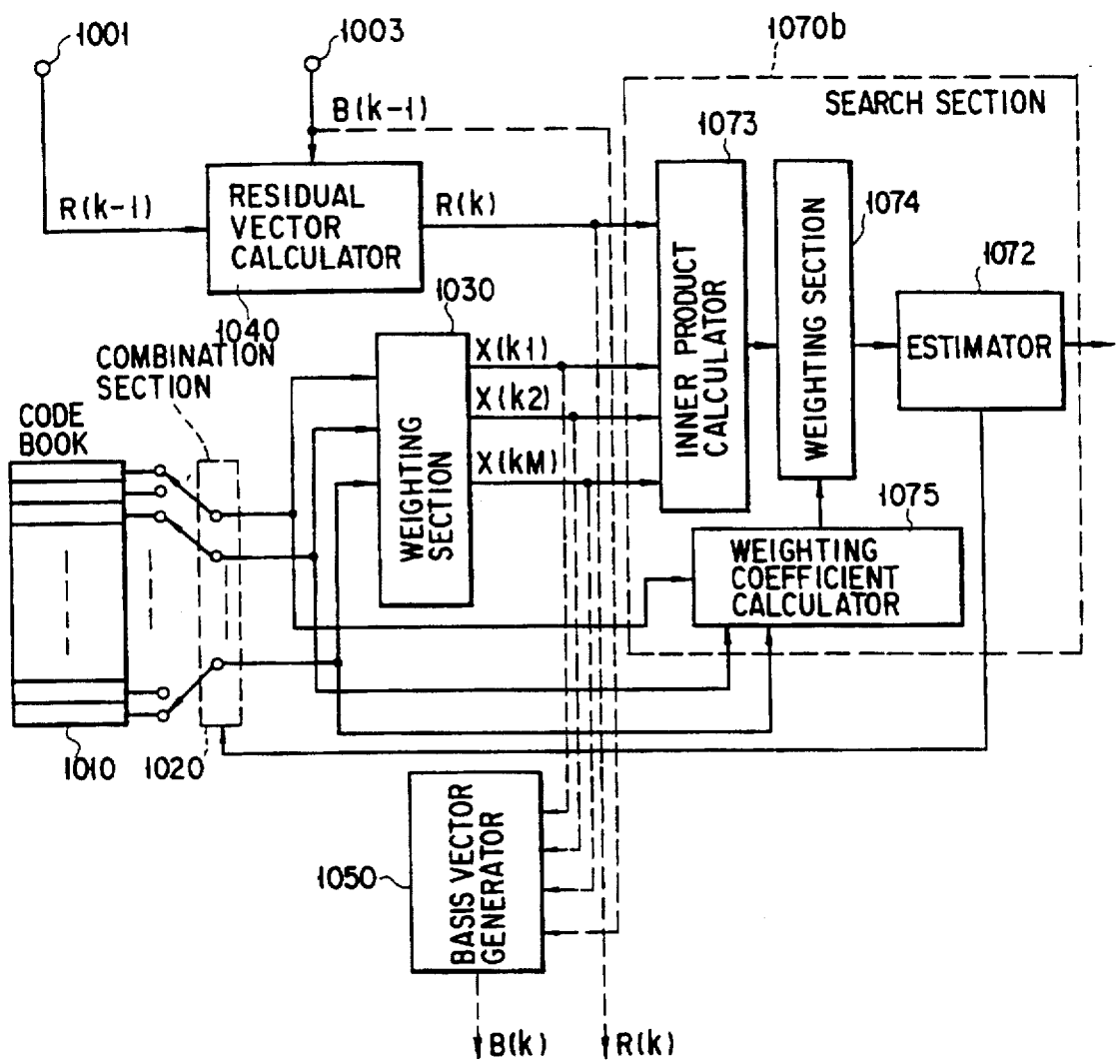
F I G. 3

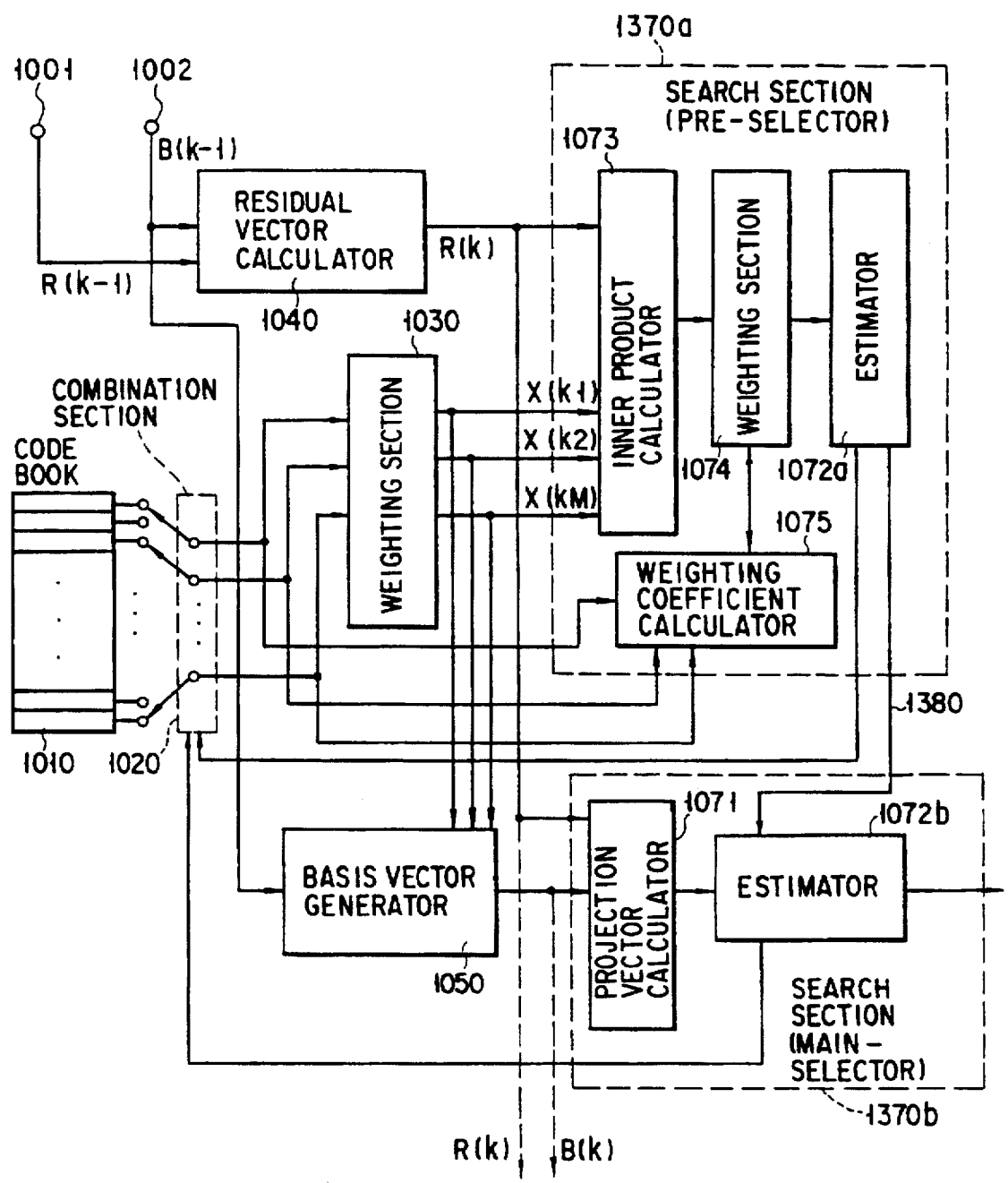
F I G. 4

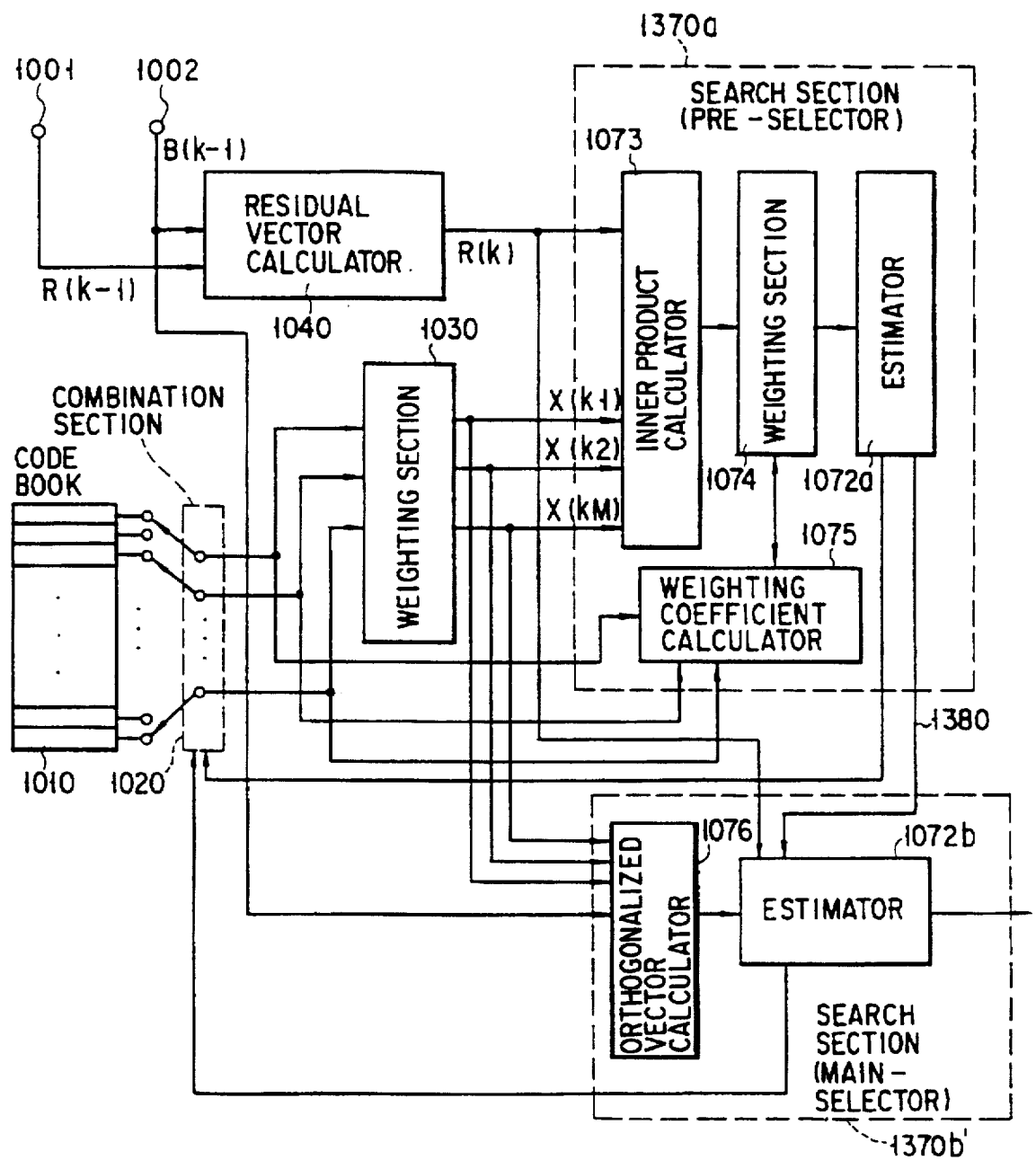
F I G. 5

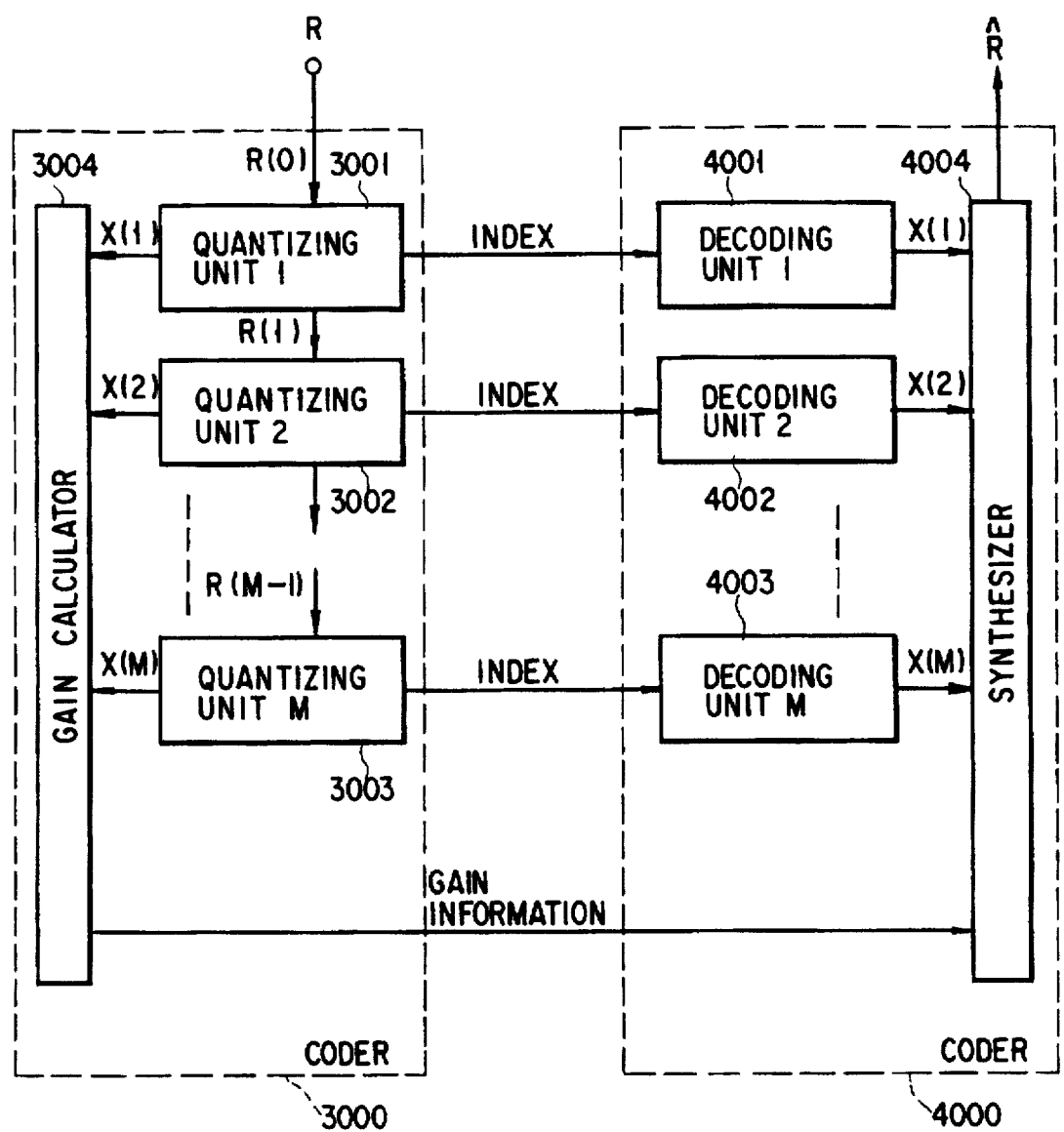
F I G. 6

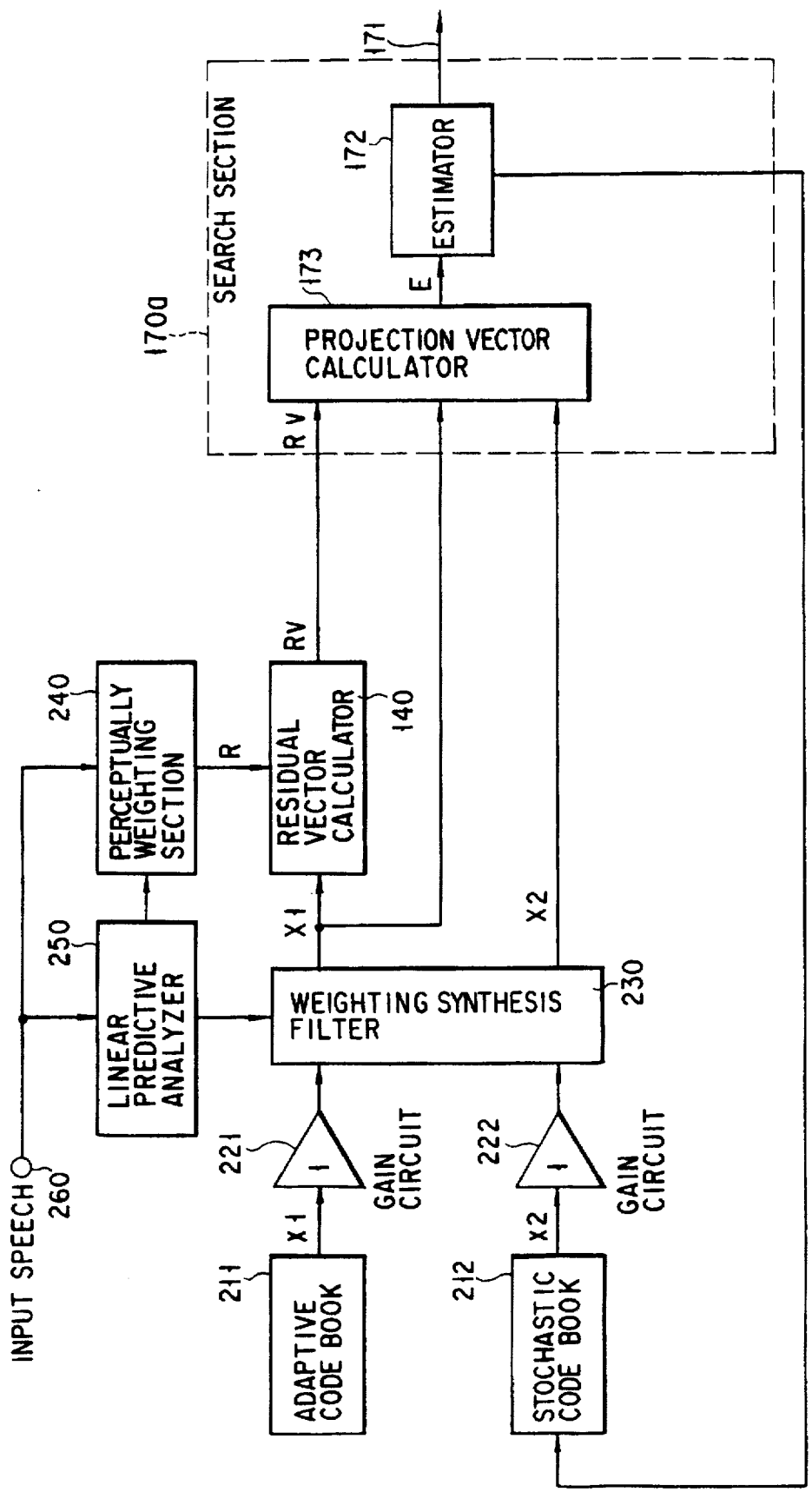
F I G. 11

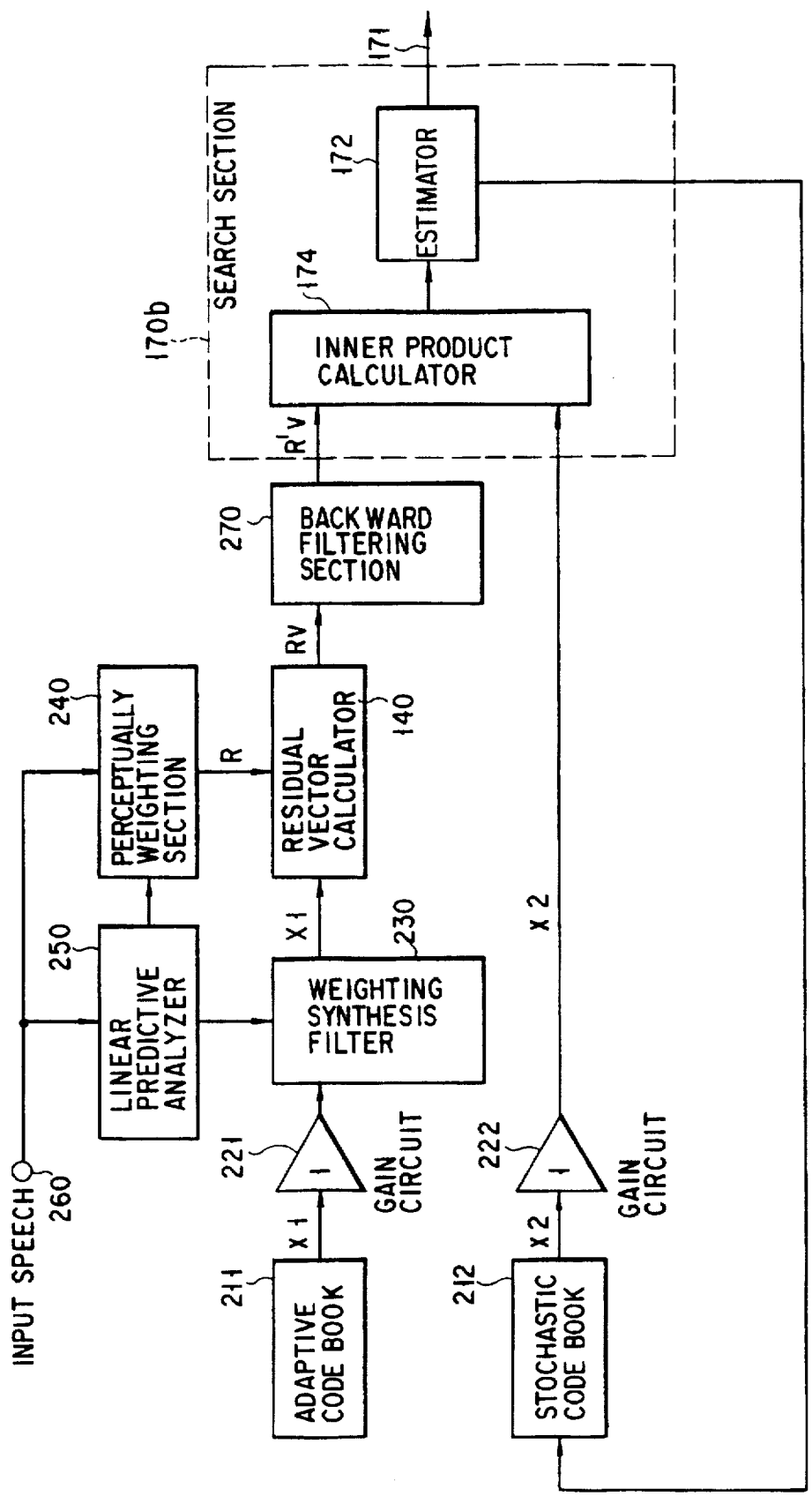
F I G. 12

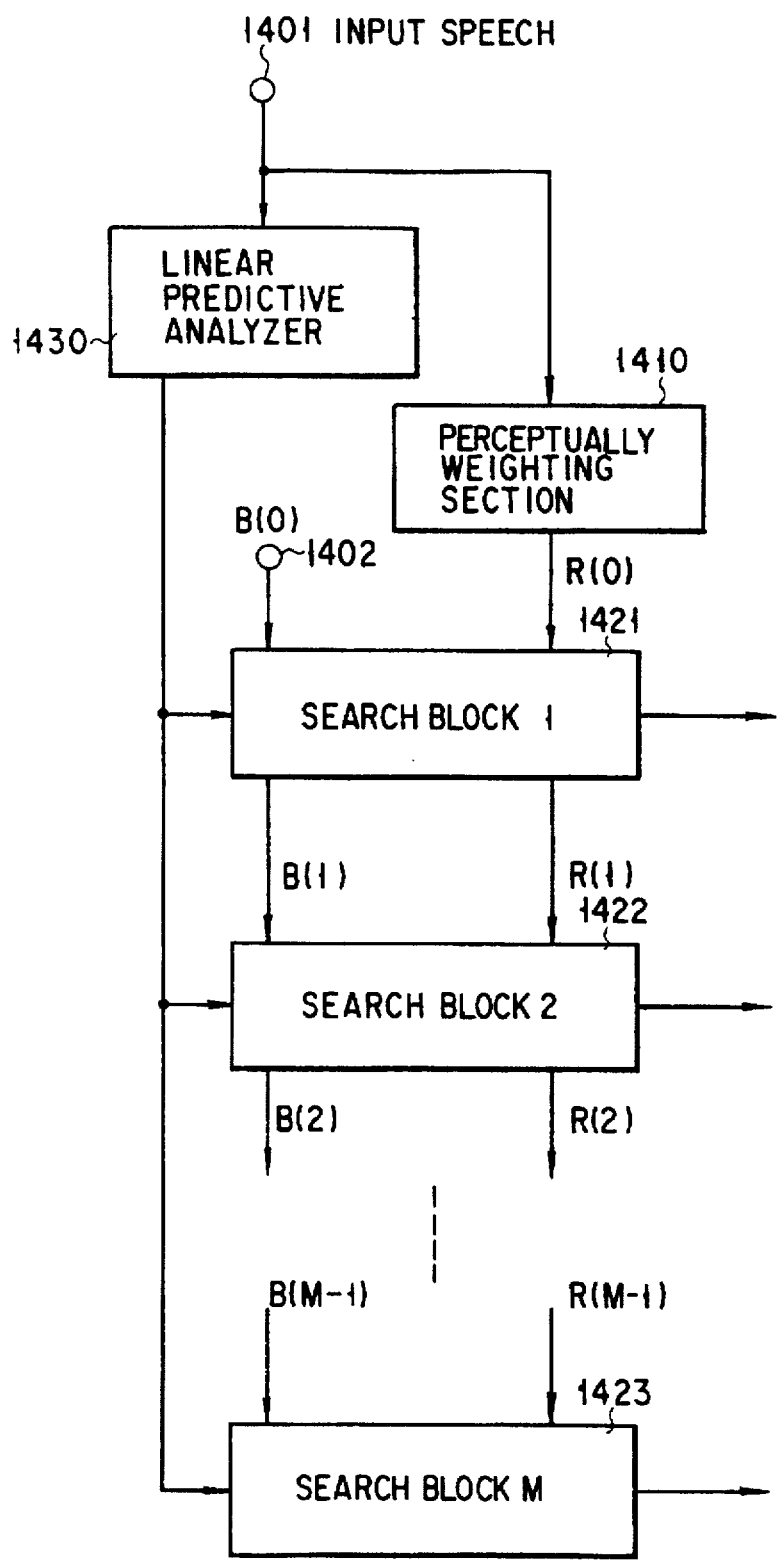
F I G. 15

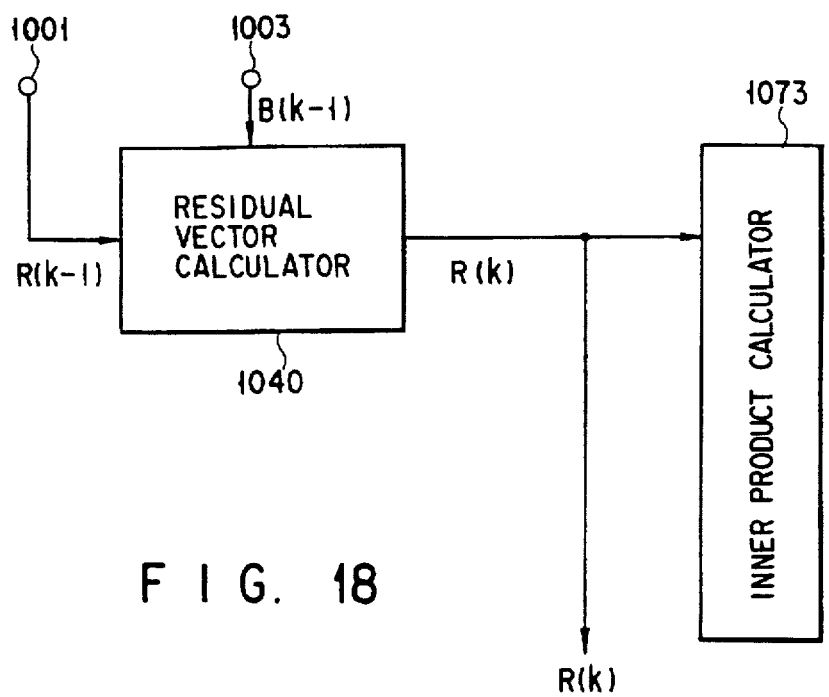
F I G. 18
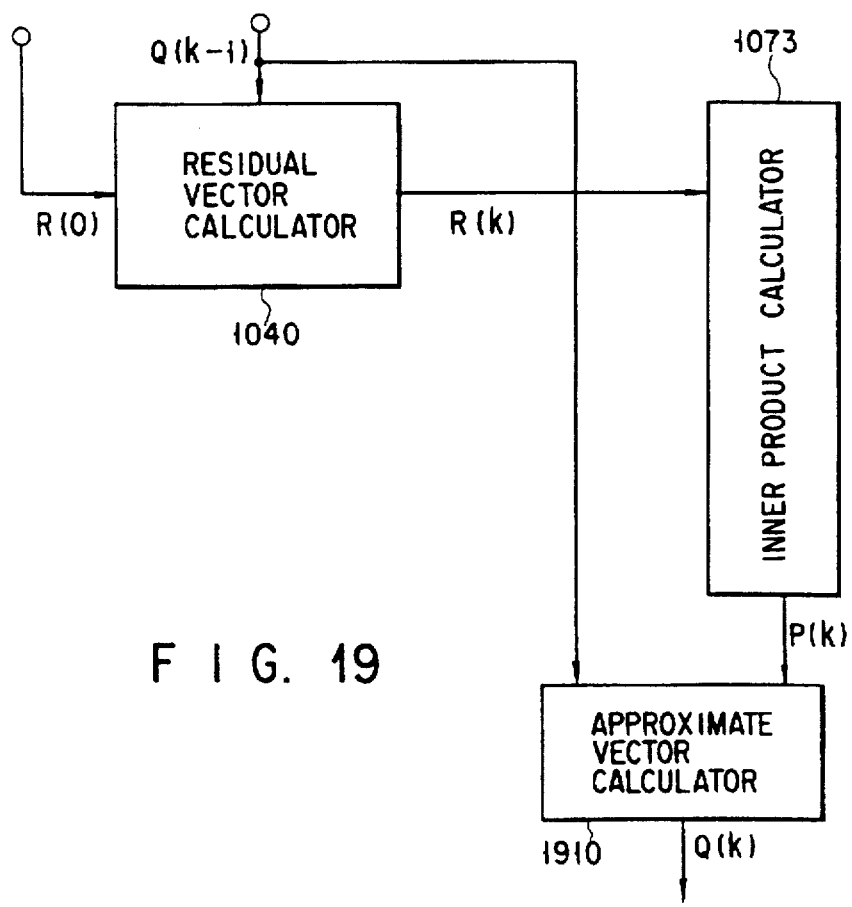
F I G. 19

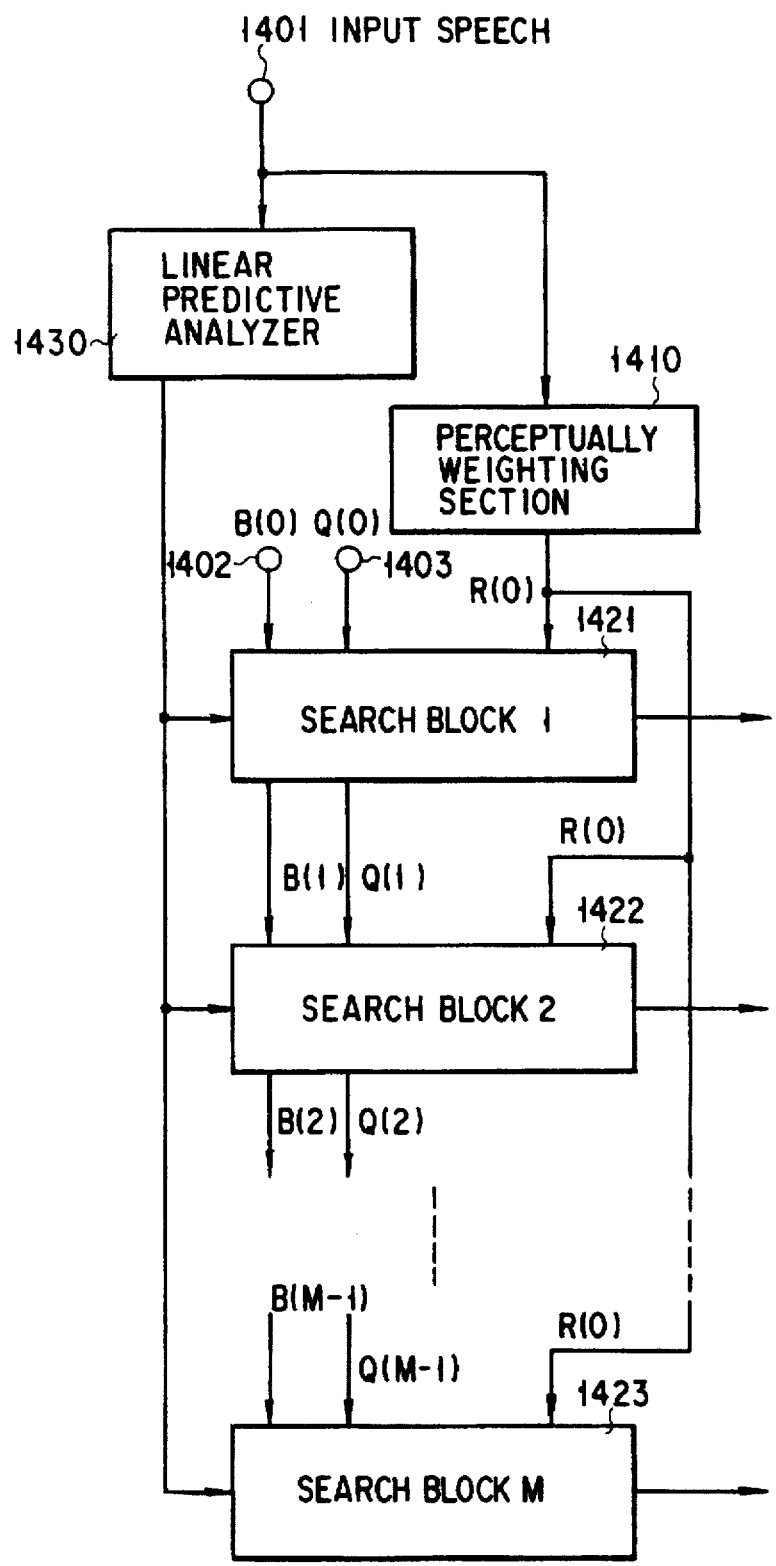
F I G. 20

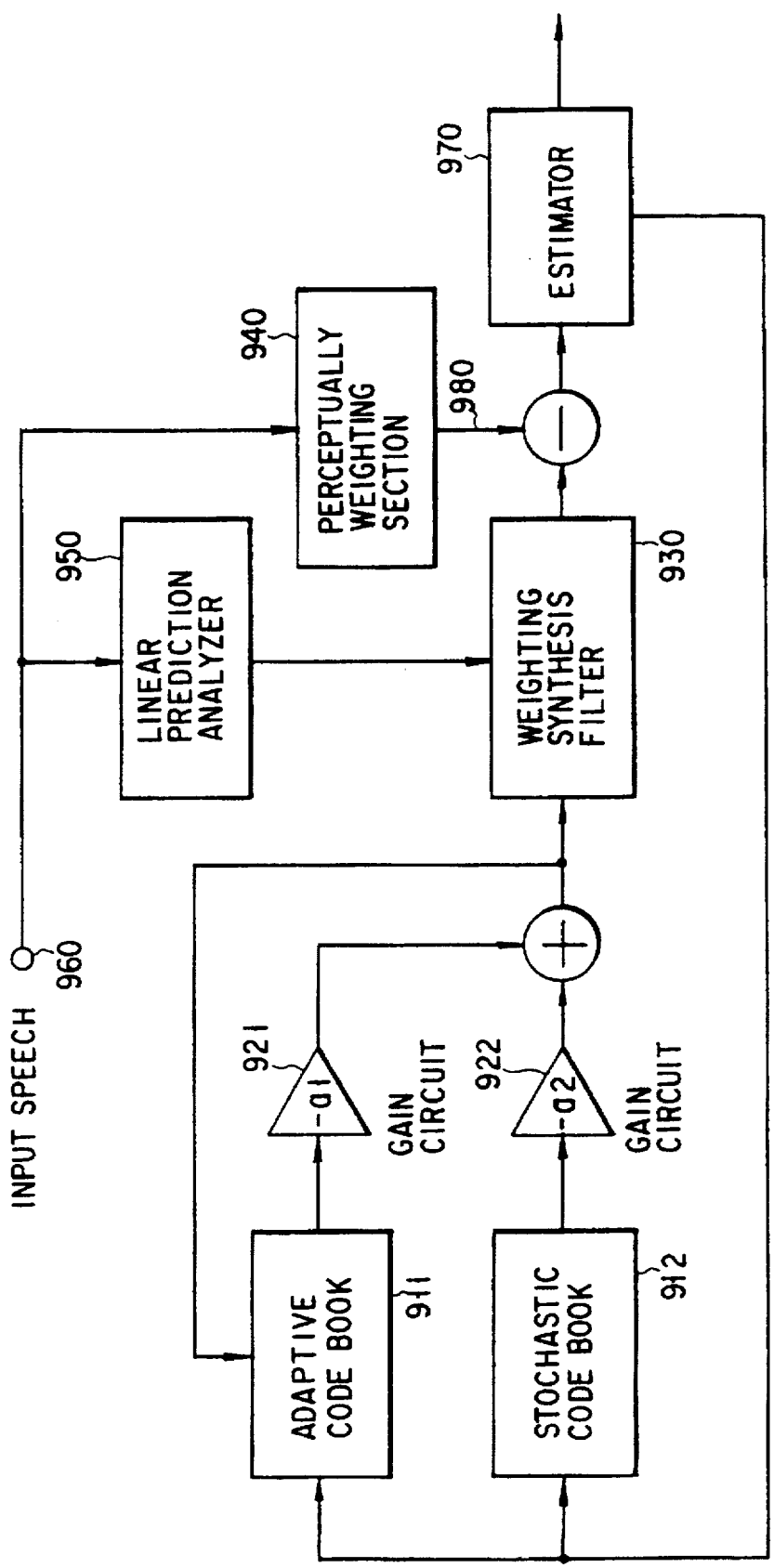
F I G. 23

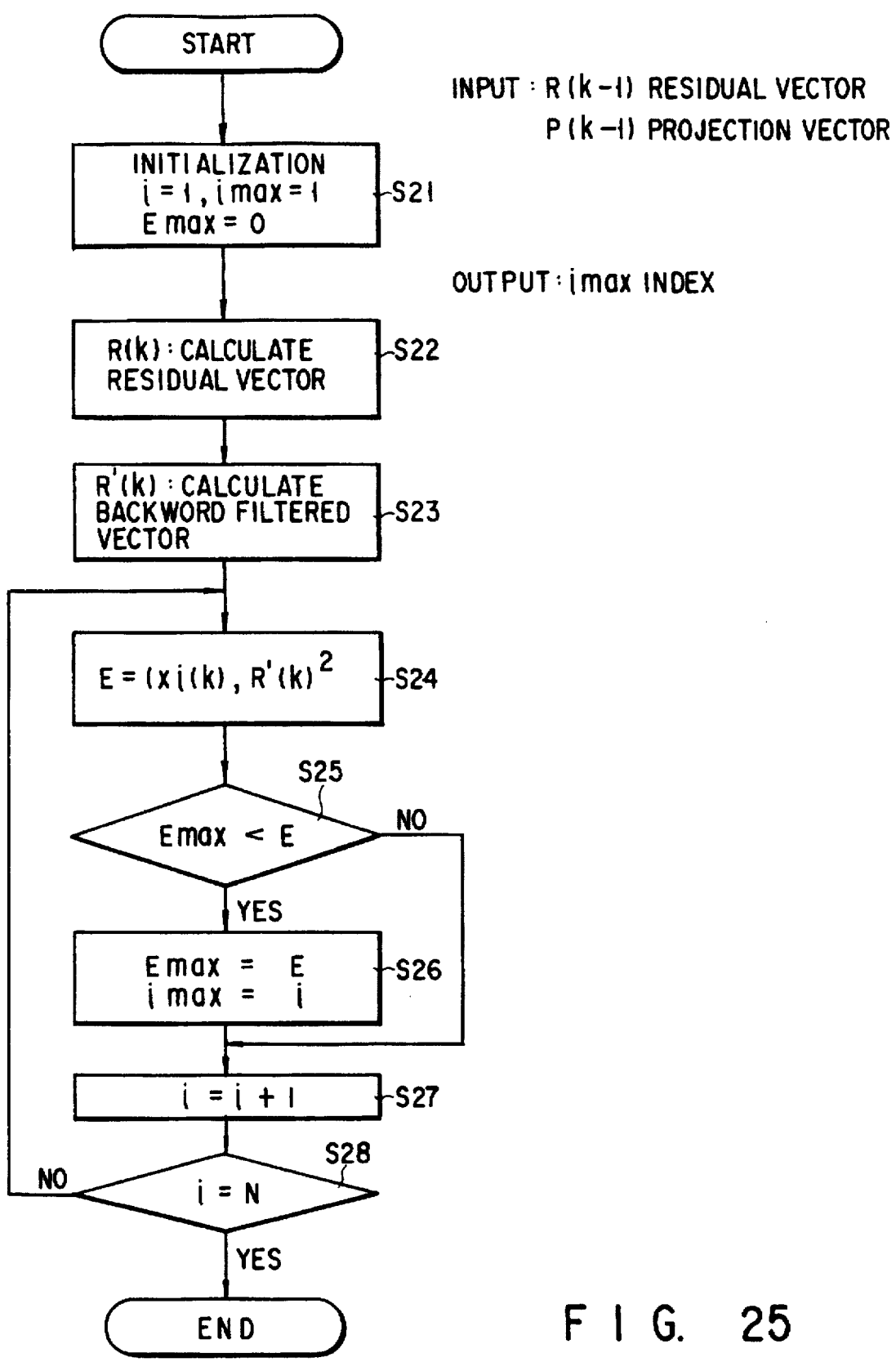
F I G. 25

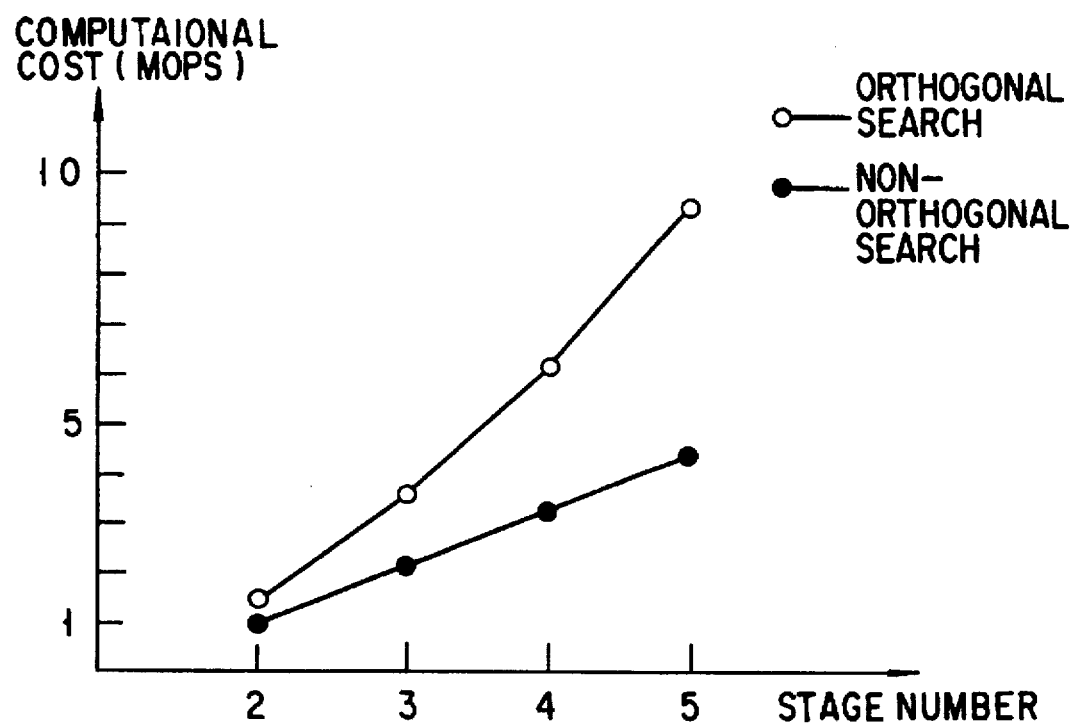
F I G. 26

VECTOR QUANTIZING APPARATUS

BACKGROUND OF THE INVENTION

1. Field of the Invention

The present invention relates to a vector quantizing apparatus for coding information signals such as speech signals and picture signals and, more particularly, to a vector quantizing apparatus using a codebook search technique based on a CELP (Code Excited Linear Prediction) method.

2. Description of the Related Art

A CELP method is one of the effective methods for use in a technique by which speech in the telephone band is coded at a transmission rate of about 4 kbps. The processing in this CELP method is roughly classified into two types of processing: one is processing for obtaining a speech synthesis filter which is the modeled form of a vocal tract obtained from an input speech divided in units of frames, and the other is processing for calculating an excitation vector corresponding to the input signal of the filter. The latter processing requires vector quantization called codebook search in which a plurality of excitation vectors stored in a codebook are passed through the speech synthesis filter one after another, each resulting synthesized speech is compared with the input speech, and an excitation vector of interest is searched from the codebook under the perceptually weighted error criterion. Generally, this vector quantization processing requires a large amount of calculations. The present invention relates to a codebook search technique based on a CELP method which includes a plurality of codebooks.

The CELP method is described in detail in, e.g., M. R. Schroeder and B. S. Atal, "Code Excited Linear Prediction (CELP): High Quality Speech at Very Low Bit Rates", Proc. ICASSP, pp. 937–940, and W. S. Kleijin, D. J. Krasinski et al., "Improved Speech Quality and Efficient Vector Quantization in SELP", Proc. ICASSP, pp. 155–158, 1988.

According to the above references, an input speech is analyzed by a linear predictive analyzer, and the coefficient of a weighted synthesis filter is calculated on the basis of the analysis. The input speech is also subjected to perceptually weighting to attain a weighted input speech. A desired vector is obtained by subtracting a zero-state response of the weighted synthesis filter from the weighted input speech. Subsequently, synthesized speech vectors are obtained by synthesizing excitation vectors one by one from an adaptive codebook. An excitation vector by which the difference (distortion vector) from the desired vector is minimized is searched from the adaptive codebook, and an optimum one is chosen as a first excitation vector. Subsequently, a second excitation vector is similarly selected from a stochastic codebook while the influence of the first excitation vector is taken into account. Finally, the first and second code vectors are multiplied by respective optimum gains and added, thereby generating an excitation signal. The adaptive codebook is updated by this excitation signal to prepare for the next frame.

In the flow described above, the processing by which the excitation vectors which minimize the magnitude of the distortion vector are searched from the adaptive codebook and the stochastic codebook is called codebook search. This codebook search is usually accomplished by first searching the adaptive codebook to select the first optimum excitation vector x1, then determining the second excitation vector x2, by searching the stochastic codebook while the influence of x1 is taken into consideration, and finally multiplying the two vectors x1 and x2 by their respective gains and adding the results.

Orthogonal search disclosed in PCT No. 5-506514 has been extensively used as a method of obtaining the optimum x2 after x1 is obtained. More specifically, a synthesized speech vector X1 is obtained by passing the given vector x1 through a synthesis filter, and a synthesized speech vector X2 is obtained by passing the vector x2 currently being searched through the synthesis filter. A vector X2v obtained by orthogonalizing the synthesized speech vector X2 with respect to the synthesized speech vector X1 is calculated by equation (1). Subsequently, the vector x2 which maximizes an estimation value E of equation (2) consisting of X2v and a desired vector R is selected.

$$X2v = X2 - \frac{(X2, X1)}{|X1|^2} X1 \quad (1)$$

$$E = \frac{(R, X2v)^2}{|X2v|^2} \quad (2)$$

Unfortunately, this method requires a large amount of calculations in the codebook search, since the search needs to be performed while all excitation vectors in the stochastic codebook are orthogonalized to X1in the synthesized speech domain.

As described above, the conventional orthogonal searching method searches the stochastic codebook while orthogonalizing synthesized speech vectors obtained from the stochastic codebook one by one with respect to the optimum synthesized speech vector chosen from the adaptive codebook. This results in a large amount of calculations being required in the codebook search.

SUMMARY OF THE INVENTION

It is an object of the present invention to provide a vector quantizing apparatus capable of searching an optimum code vector with a much smaller amount of calculations than in conventional methods, without performing orthogonalization of code vectors.

According to the present invention, there is provided a vector quantizing apparatus comprising a residual vector calculator for calculating a residual vector corresponding to a difference between a desired vector and an approximate vector which is approximate to the desired vector, a selector for selecting at least one code vector from a set of code vectors, a basis vector generator for obtaining, as a set of second basis vectors, basis vectors in a vector space formed by the code vector selected by the selector and basis vectors constituting a set of first basis vectors, a projection vector calculator for searching, from the set of code vectors, a combination of code vectors which increases a projection vector obtained by projecting the residual vector in a vector space formed by the set of second basis vectors, and an estimator for outputting information specifying the combination of code vectors searched by the search section.

According to the present invention, in searching a combination of code vectors, the vector space formed by synthetic vectors of the combination of code vectors and first basis vectors is first obtained. The magnitude of a projection vector obtained by projecting a residual vector in this vector space is calculated as an estimation value. A combination of code vectors by which this estimation value is maximized is searched as a combination of optimum code vectors. In this search method, it is not necessary to orthogonalize the combination of code vectors during the search. Consequently, the search can be performed with a smaller amount of calculations than in the conventional orthogonal search.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing the arrangement of a vector quantizing apparatus according to Embodiment 1;

FIG. 2 is a block diagram showing the arrangement of a vector quantizing apparatus according to Embodiment 2;

FIG. 3 is a block diagram showing the arrangement of a vector quantizing apparatus according to Embodiment 3;

FIG. 4 is a block diagram showing the arrangement of a vector quantizing apparatus according to Embodiment 4;

FIG. 5 is a block diagram showing the arrangement of a vector quantizing apparatus according to Embodiment 5;

FIG. 6 is a block diagram showing the arrangement of a vector quantizing apparatus according to Embodiment 6;

FIG. 11 is a block diagram showing the arrangement of a vector quantizing apparatus according to Embodiment 10;

FIG. 12 is a block diagram showing the arrangement of a vector quantizing apparatus according to Embodiment 11;

FIG. 15 is a block diagram showing the arrangement of a vector quantizing apparatus according to Embodiment 15;

FIG. 18 is a block diagram showing one arrangement for obtaining a second residual vector;

FIG. 19 is a block diagram showing another arrangement for obtaining a second residual vector;

FIG. 20 is a block diagram showing the arrangement of a modification of the vector quantizing apparatus according to Embodiment 15;

FIG. 23 is a schematic view showing a CELP coding method;

FIG. 25 is a flow chart showing the optimum code vector search sequence in Embodiment 2; and FIG. 26 is a graph showing the comparison of the computational cost in the conventional orthogonal search with that in the non-orthogonal search of the present invention.

DETAILED DESCRIPTION OF THE PREFERRED EMBODIMENTS

Figure 7:
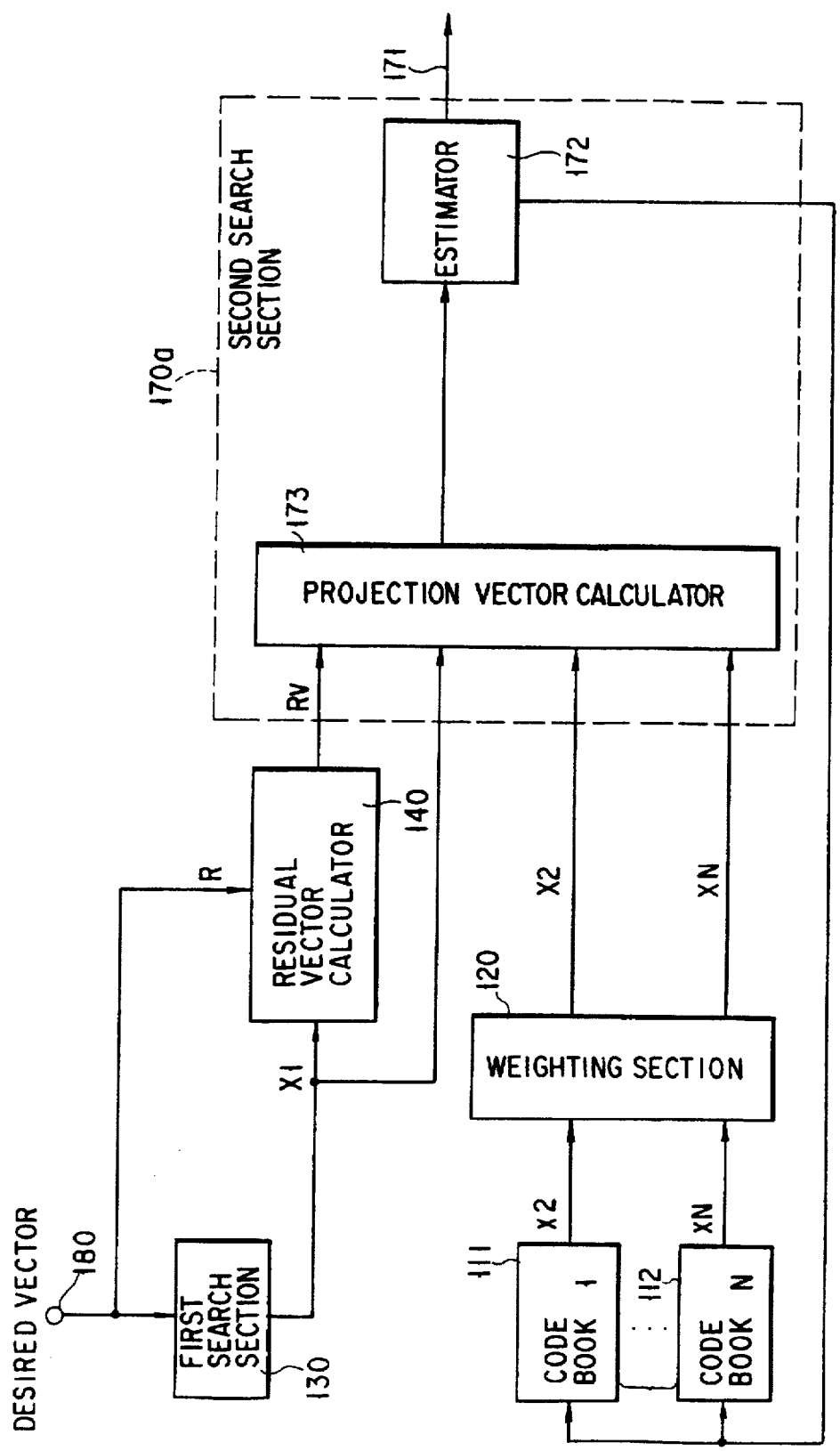
FIG. 7 is a block diagram showing the arrangement of a vector quantizing apparatus according to Embodiment 7.

Embodiments of the present invention will be described below with reference to the accompanying drawings.

(EMBODIMENT 1)

FIG. 1 shows the arrangement of a vector quantizing apparatus according to this embodiment. This vector quantizing apparatus comprises a codebook 1010, a combination section 1020, a weighting section 1030, a residual vector calculator 1040, a basis vector generator 1050, and a search section 1070a. The search section 1070a includes a projection vector calculator 1071 and an estimator 1072. The residual vector calculator 1040 calculates a residual vector R(k) which serves as a desired vector of search. This embodiment employs, as one practical example, the configuration in which the residual vector R(k) is calculated from a residual vector in the preceding stage and a set of output basis vectors from the preceding stage. More specifically, the residual vector calculator 1040 makes use of a residual vector R(k-1) in the preceding stage, which is applied to a terminal 1001, and a set B(k-1) of first basis vectors, which is applied to a terminal 1002. The calculator 1040 subtracts, from the residual vector R(k-1), a projection vector which is obtained by projecting R(k-1) in the space formed by the basis vector B(k-1), thereby calculating the residual vector R(k) as a desired vector.

M code vectors chosen from the codebook 1010 by the combination unit 1020 are processed into weighted code vectors X(k1), X(k2), . . . , X(kM) by the weighting section 1030 and input to the basis vector generator 1050. The generator 1050 obtains a space formed by synthetic vectors of the code vectors X(k1), X(k2), . . . , X(kM) and the basis vectors constituting the first basis vector set applied to the terminal 1002. The generator 1050 calculates the consequent basis vectors and outputs them as a second basis vector set B(k).

The residual vector R(k) and the second basis vector set B(k) thus obtained are input to the projection vector calculator 1071 of the search section 1070a. The calculator 1071 calculates the magnitude of a projection vector P(k) which is obtained by projecting the residual vector R(k) in the space formed by the set B(k). The calculated value is input to the estimator 1072.

The estimator 1072 controls the combination section 1020 to search, as an optimum code vector, a combination of M code vectors by which the magnitude of the input value from the projection vector calculator 1071, i.e., the projection vector P(k), is maximized. The estimator 1072 outputs information (index) specifying this optimum code vector, as the search result.

Note that the configuration of this embodiment in which M code vectors are searched from the single codebook 1010 is merely an example of the codebook search. Embodiment 7 to be described later, for example, employs a method by which one code vector is chosen from each of N codebooks. Generally, the codebook search can be thought of as selecting code vectors from a set of code vectors. This includes a method in which a simple calculation (e.g., linear combination) is performed for a small number of basic vectors included in a codebook, thereby forming a codebook which in effect contains a large number of code vectors. In practice, M=1 is used in many instances due to the limitations of, e.g., the computational cost. This also applies to the embodiments to be described later.

One example of the weighting section 1030 is a weighted synthesis filter used in speech coding or the like. It is also possible to design an arrangement which does not essentially perform weighting, by setting 1 as the weighting coefficient of the weighting section 1030. That is, the weighting section 1030 can be omitted. This is also the case for the embodiments to be presented later.

The basis vector generator 1050 generates the second basis vector set B(k) from the first basis vector set B(k-1) and the code vectors X(k1), X(k2), . . . , X(kM). Although various methods are usable as this B(k) generation method, one simplest approach is to obtain a direct sum. That is, when B(k-1) consists of m basis vectors b(k-1), b2(k-1), . . . , bm(k-1), B(k)={b1(k-1), b2(k-1), . . . , bm(k-1), X(k1), X(k2) . . . , X(kM) } is calculated. Another method is to constitute B(k) by recurrently using the projection vector of the residual vector.

The search section 1070a searches a combination of code vectors by which the magnitude of the second projection vector P(k) as an input value is maximized. Commonly, one optimum combination is selected. However, a plurality of optimum code vectors are chosen in some cases since delayed decision that is recently often used in the CELP coding is utilized. This is also true for the embodiments to be described later.

Figure 24:
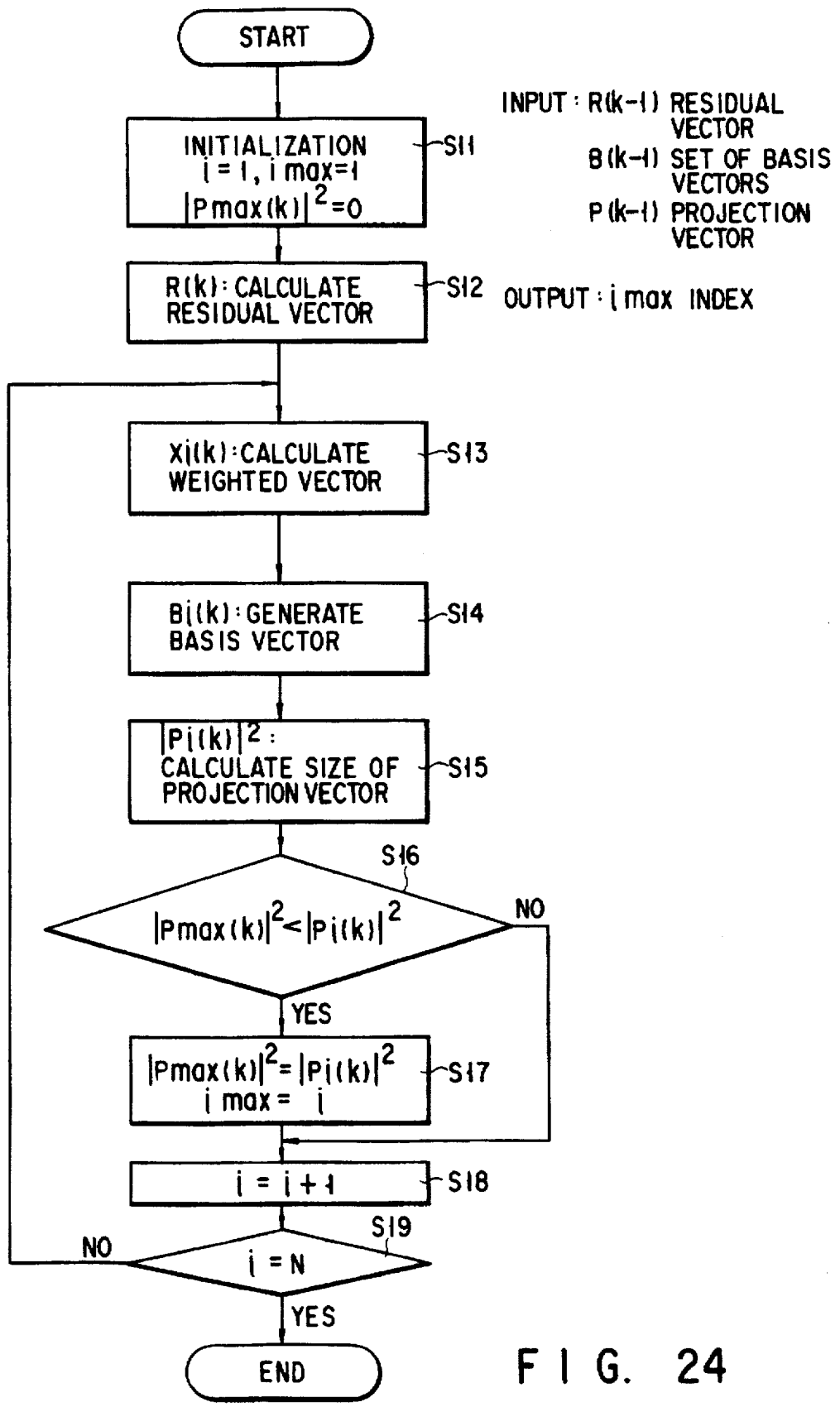
FIG. 24 is a flow chart showing the optimum code vector search sequence in Embodiment 1.

The flow of the code vector search processing in this embodiment will be described below with reference to the flow chart in FIG. 24. For simplicity, assume that only one code vector is to be searched (i.e., a code vector combination consists of one code vector), the condition of END is the completion of search of the entire codebook 1010, and the magnitude of a projection vector is the square of the length of that vector.

[Step S11] Perform initialization by setting i=1, imax=1, and |Pmax(k)|$^2$=0, where imax is an index as information which specifies an optimum code vector, and |Pmax(k)|$^2$ represents the maximum value of the magnitude of a projection vector.

[Step S12] Calculate a residual vector R(k).

[Step S13] Calculate a weighted code vector Xi(k).

[Step S14] Generate a basis vector Bi(k).

[Step S15] Calculate the magnitude |Pi(k)|$^2$ of a projection vector.

[Step S16] Compare the magnitude |Pi(k)|$^2$ calculated in step S15 with the maximum value |Pmax(k)|$^2$ of the magnitude of the projection vector calculated previously.

[Step S17] If the comparison result in step S16 is |Pmax(k)|$^2$<|Pi(k)|$^2$, update |Pmax(k)|$^2$ by |Pi(k)|$^2$, and set the corresponding i as the index imax.

[Step S18] After the processing in step S17, or, if the comparison result in step S16 is |Pmax(k)|$^2$>|Pi(k)|$^2$, increment i by one.

[Step S19] Check whether i has reached a set value N. Repeat the processing from step S13 to step S18 until i=N. End the series of processing when i=N.

As described above, in this embodiment, an optimum code vector is searched by using a residual vector. This eliminates the need for orthogonalization of code vectors in the search loop, as in conventional orthogonal search methods. Consequently, the search can be done with a small amount of calculations, especially when it is combined with a pre-selection method.

(EMBODIMENT 2)

FIG. 2 shows the configuration of a vector quantizing apparatus according to this embodiment. In this embodiment, the arrangement of a search section 1070b differs from that of Embodiment 1 illustrated in FIG. 1. That is, in Embodiment 1, the search section 1070a obtains the magnitude of the second projection vector P(k). In the search section 1070b of this embodiment, an inner product value calculator 1073 calculates the value of the inner product of a residual vector R(k) and a code vector X(k) which is weighted by a weighting section 1030, and sends the calculated value to estimator 1072.

In accordance with an estimation method based on this inner product value, the estimator 1072 searches an optimum code vector. Examples of the estimation method based on the inner product value are (1) increasing the inner product value if a code vector combination consists of one vector, and (2) increasing the sum of the inner product values if a code vector combination consists of a plurality of vectors.

FIG. 25 is a flow Chart showing the flow of the code vector search processing in this embodiment. FIG. 25 shows an example in which the same limitations as in FIG. 24 are used. In FIG. 25, the square of the inner product value is used as an estimation value based on the inner product value.

[Step S21] Perform initialization by setting i=1, imax=1, and Emax=0, where imax is an index as information which specifies an optimum code vector, and Emax represents the maximum value of the inner product.

[Step S22] Calculate a residual vector R(k).

[Step S23] Calculate a vector R'(k) by performing a backward filtering for the residual vector.

[Step S24] Calculate the inner product value E=(xi(k), R'(k))2.

[Step S25] Compare the inner product value E calculated in step S24 with the maximum value Emax of the inner products calculated previously.

[Step S26] If the comparison result in step S26 is Emax<E, update Emax by E, and set the corresponding i as the index imax.

[Step S27] After the processing in step S26, or, if the comparison result in step S25 is Emax>E, increment i by one.

[Step S28] Check whether i has reached a set value N. Repeat the processing from step S24 to step S27 until i=N. End the series of processing when i=N.

Note that flow charts will be omitted in the embodiments described below since the code vector search sequence in each embodiment can be expressed by properly combining or correcting the flow charts shown in FIGS. 24 and 25.

The calculation of the inner product value performed by the search section 1070b in this embodiment is an approximate calculation of the projection vector calculation in Embodiment 1. However, this inner product value calculation has the advantage of largely decreasing the computational cost. As an example, if a similar calculation is performed using conventional orthogonal search, code vectors must be orthogonalized prior to calculating the inner product value, and the computational cost increases accordingly. In contrast, in this embodiment any orthogonalization need not be performed, so code vectors can be searched with a much smaller computational cost than in the conventional method.

Also, to perform multistage quantization by using a plurality of stages of vector quantizing apparatuses, in the search in the kth stage, the orthogonal search method is necessary to calculate the inner product values while orthogonalizing all code vectors obtained in the search up to the (k-1)th stage. In this embodiment, however, once a residual vector is obtained, the calculation of the inner product values remains unchanged regardless of the number of search stages. Therefore, as the number of stages is increased, the computational cost decreasing effect of this embodiment is enhanced compared to the conventional method (with referring to FIG. 26). The search result obtained in this embodiment is similar to that obtained in the conventional method (the reason will be described in Embodiment 7 later).

(EMBODIMENT 3)

FIG. 3 shows the arrangement of a vector quantizing apparatus according to this embodiment. In a search section 1070b in this embodiment, a weighting section 1074 is inserted between an inner product calculator 1073 and an estimator 1072. An inner product calculated by the inner product calculator 1073 is weighted by a weighting coefficient calculated on the basis of a code vector by a weighting coefficient calculator 1075. An optimum code vector is searched by an estimation method based on this weighted inner product. The estimation method in the estimator 1072 can be the same method as explained in Embodiment 2.

In this embodiment, the accuracy of the search is improved although the computational cost is somewhat increased by the weighting performed for the inner product. Also, unlike in conventional methods, no orthogonalization is performed in this embodiment. Consequently, search can be accurately performed with a small computational cost.

(EMBODIMENT 4)

FIG. 4 shows the arrangement of a vector quantizing apparatus according to this embodiment. A search section of this embodiment is constituted by two stages, a pre-selector 1370a and a main-selector 1370b. The pre-selector 1370a selects several code vectors as pre-selected candidates by using a search method capable of searching code vectors with a small computational cost. As with the search section 1070b of Embodiment 3 illustrated in FIG. 3, the pre-selector 1370a of this embodiment consists of an estimator 1072, an inner product calculator 1073, a weighting section 1074, and a weighting coefficient calculator 1075. It is, however, also possible to design the pre-selector 1370a to have the same configuration as the search section 1070b in Embodiment 2 shown in FIG. 2.

Information 1380 on the pre-selected candidates selected by the pre-selector 1370a is transferred to the main-selector 1370b. For these pre-selected candidates, the main-selector 1370b performs a high-accuracy search method, e.g., a method analogous to that of the search section 1070a of Embodiment 1, selecting one or a plurality of code vectors from the pre-selected candidates, as optimum code vectors. The main-selector 1370b then outputs an index as information specifying the optimum code vectors as the search result.

This embodiment has the configuration having the merits of both Embodiments 1 and 3; better code vector candidates can be chosen with a smaller computational cost. That is, since the pre-selector 1370a is capable of the inner product calculation without performing orthogonalization, the computational cost can be greatly decreased. Additionally, the code vector search accuracy can be improved because the main-selector 1370b calculates the perfect estimation expression.

Note that the search section can also be constituted by three or more stages. For example, two pre-selectors can be provided. In this case, the second-stage pre-selector selects candidates from those selected by the first-stage pre-selector, and main selection is performed for the candidates thus selected by the second-stage pre-selector.

(EMBODIMENT 5)

FIG. 5 illustrates the configuration of a vector quantizing apparatus according to this embodiment. In this embodiment, the arrangement of the main-selector 1370b of Embodiment 4 is modified. That is, in a main-selector 1370b' of this embodiment, an orthogonalized vector calculator 1076 calculates a vector orthogonalized in the space, which is formed by a first basis vector, from a code vector weighted by a weighting section 1030. An estimator 1072b estimates pre-selected candidates from a pre-selector 1370a by dividing the inner product calculated by the pre-selector by the orthogonalized vector, thereby selecting an optimum code vector.

(EMBODIMENT 6)

FIG. 6 illustrates the arrangement of an embodiment of a vector coder/decoder to which the vector quantizing apparatus of the present invention is applied. A coder 3000 performs multistage (M-stage) vector quantization for an input desired vector R. At least one of M quantizing units 3001 to 3003 performs the quantization by using the vector quantizing apparatus of any of Embodiments 1 to 5 described above. Indices specifying optimum code vectors searched by the quantizing units 3001 to 3003 and gain information obtained by a gain calculator 3004 are transmitted to a decoder 4000.

In the decoder 4000, M decoding units 4001 to 4003 decode the code vectors from the indices transmitted from the coder 3000. A synthesizer 4004 obtains the quantized value of the desired vector from these decode vectors and the gain information.

When any of Embodiments 1 to 5 is applied to a multistage vector quantizing system as described above, the effect of decreasing the computational cost can naturally be obtained. In addition, since the processing is done in a recurrent manner, it is possible to relatively easily realize the processing regardless of whether the processing is effected by software or hardware.

(EMBODIMENT 7)

FIG. 7 shows the arrangement of a vector quantizing apparatus according to this embodiment. This vector quantizing apparatus comprises codebooks 111 to 112, a weighting section 120, a first search section 130, a residual vector calculator 140, and a second search section 170a. The second search section 170a includes an estimator 172 and a projection vector calculator 173.

The first search section 130 outputs a vector (to be referred to as an approximate vector hereinafter) X1 which is approximate to a desired vector input to an input terminal 180. The residual vector calculator 140 calculates a residual vector Rv between the approximate vector X1 and the desired vector, R. This residual vector Rv is input to the projection vector calculator 173. Meanwhile, code vectors x2 to xN each selected from a corresponding one of the codebooks 111 to 112 are weighted by the weighting section 120. Consequent weighted vectors X2 to XN are input to the projection vector calculator 173.

The calculator 173 calculates the magnitude of the projection vector of the residual vector Rv with respect to the space formed by the approximate vector X1 and the vectors X2 to XN. The estimator 172 searches a code vector by which this projection vector Rv is maximized from the codebooks 111 to 112, and outputs information specifying this code vector as a search result 171. Note that the search result can be either a code which directly indicates the code vector or information, such as a pitch period, which indirectly specifies the code vector.

The reason why an optimum code vector is calculated by the configuration of this embodiment will be geometrically explained with reference to FIG. 8. The desired vector R is best approximated by linear combination of the approximate vector X1 and the vectors X2 to XN. This is equivalent to minimizing the magnitude $|R-Rp|$ of a distortion vector, assuming that the projection vector of the desired vector R with respect to the space formed by the vectors X1 and X2 to XN is Rp. Assuming that the residual vector when the desired vector R is approximated to the approximate vector is Rv and that the projection vector of this residual vector Rv is Rvp, $$|R-Rp|=|Rv-Rvp|$$

Therefore, minimizing $|R-Rp|$ is equivalent to minimizing $|Rv-Rvp|$.

Since Rvp is a projection vector, a triangle formed by Rv and Rvp is a right triangle. From the theorem of three squares, therefore, $$|Rv|^2=|Rvp|^2+|Rv-Rvp|^2$$

During search, the approximate vector X1 and the desired vector R are fixed vectors, so the residual vector Rv which corresponds to the oblique side of the right triangle also is fixed. This implies that minimizing $|Rv-Rvp|$ is equivalent to maximizing the magnitude $|Rvp|$ of the projection vector of the residual vector Rv.

The foregoing will be described in more detail below by using mathematical expressions. The residual vector Rv is given by equation (3) below.

$$Rv = R - \frac{(R, X1)}{|X1|^2} X1 \quad (3)$$

Rvp is expressed by the following equation since it is a vector on the plane defined by Xl to XN.

$$Rvp=a1*X1+a2*X2+\ldots+aN*XN \quad (4)$$

Coefficients a1 to aN are so determined as to minimize $|Rv-Rvp|$. Details of the determination method are described in Japanese Patent Application No. 6-96655. Substituting equations (3) and (4) into the expression of $|Rv-Rvp|^2$ and rearranging the resulting equation, $$|Rv-Rvp|^2=|Rv|^2-|Rvp|^2 \quad (5)$$

is obtained. Since $|Rv|^2$ is a constant, maximizing the length Rvp2 of the projection vector is equivalent to minimizing the error $|Rv-Rvp|$.

The coefficient $(R, X1)/|X1|^2$ of the second term X1 in equation (3) is an optimum gain when R is to be approximated only by X1. If it is necessary, for the coding convenience or the like, to quantize this optimum gain or to calculate a value corresponding to the optimum gain, the residual vector Rv can be calculated by using the obtained value instead of the optimum gain $(R, X1)/|X1|^2$.

The calculation result when only one vector is weighted will be described in detail below. Assuming the projection vector Rvp of Rv is $$Rvp=a1*X1+a2*X2 \quad (6)$$

the length of $|Rvp|^2$ of this projection vector Rvp is given by equation (7) below according to the method described in Japanese Patent Application No. 6-96655.

$$|Rvp|^2=\{|X1|^2*(Rv, X2)^2-2*(Rv, X1)(X1, X2)(X2, Rv)+|X2|^2*(Rv, X1)\}/D \quad (7)$$

Note, however, that $$D=|X1|^2*|X2|^2-(X1, X2)^2 \quad (8)$$

Since the inner product (X1, Rv) of equation (3) and X1 is 0, the second and third terms of equation (7) also are 0, so equation (9) below is obtained.

$$|Rvp|^2=\{|X1|^2*(Rv, X2)^2\}/D \quad (9)$$

Since X1 is fixed, it is only necessary to search X2 by which an estimation value given by the following equation is maximized.

$$E=\{(Rv, X2)^2\}/D \quad (10)$$

In the case wherein only one weighted vector is available, the orthogonal search method (PCT No. 5-506514) has been conventionally used in many instances. According to this embodiment, however, the same result as in this conventional method can be obtained. The reason for this is that when equation of orthogonal search is developed and modified by using equation (1), as represented by equation (11) below, the result is equal to equation (9) of this embodiment. Note that the modification of the numerator from the third line to the fourth line of equation (11) is accomplished using the relationship of equation (3).

$$\begin{aligned} E &= \frac{(R, X2v)^2}{|X2v|^2} X1 \\ &= \frac{\{(R, X2)-(R, X1)(X1, X2)/|X1|^2\}^2}{|X2|^2-\{(X2, X1)/|X1|^2\}|X1|^2} \\ &= \frac{(R-[(R, X1)/|X1|^2]X1, X2)^2}{|X2|^2-(X2, X1)^2/|X1|^2} \\ &= \frac{|X1|^2 \cdot (Rv, X2)^2}{D} \end{aligned} \quad (11)$$

In the conventional orthogonal search method, search is performed while obtaining X2v, which is the orthogonalized form of the candidate vector X2, in the search loop. In contrast, the method of this embodiment can be thought of as obtaining Rv, which is the orthogonalized form of the desired vector R, outside the search loop and searching the candidate vector X2 in the search loop without orthogonalizing it. Therefore, any orthogonalization need not be performed in the search loop. This results in an advantage in that exactly the same result as in the conventional orthogonal search can be obtained and the codebook search can be realized with a small amount of calculations.

(EMBODIMENT 8)

Figure 9:
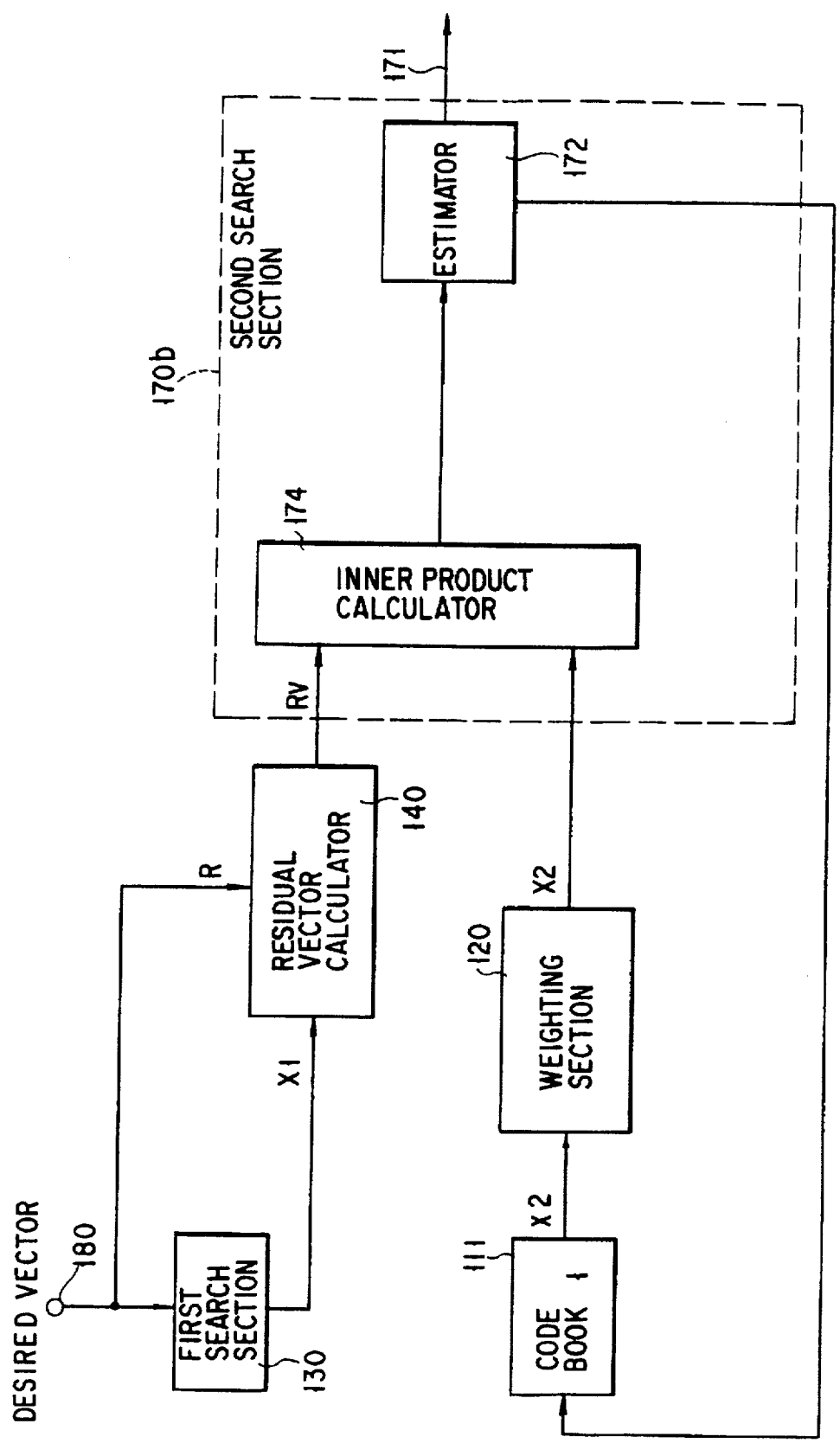
FIG. 9 is a block diagram showing the arrangement of a vector quantizing apparatus according to Embodiment 8.

FIG. 9 shows the configuration of a vector quantizing apparatus according to this embodiment. This embodiment relates to a method of approximately and efficiently calculating estimation values, and differs from Embodiment 7 in the arrangement of a second search section 170$b$. That is, instead of obtaining the magnitude of a projection vector as in Embodiment 7, in this embodiment, an inner product calculator 174 calculates the inner product of a residual vector and a desired vector (weighted code vector), and an estimator 172 obtains a code vector by which this inner product is maximized. Use of only the inner product means that only the numerator of equation (10) is calculated assuming that the denominator of the expression is a fixed value. Since this is an approximate calculation, it is not always possible to obtain an optimum code vector. However, the method has the advantage that quasi-optimum candidates can be obtained with a further smaller computational cost than in Embodiment 7.

(EMBODIMENT 9)

Figure 10:
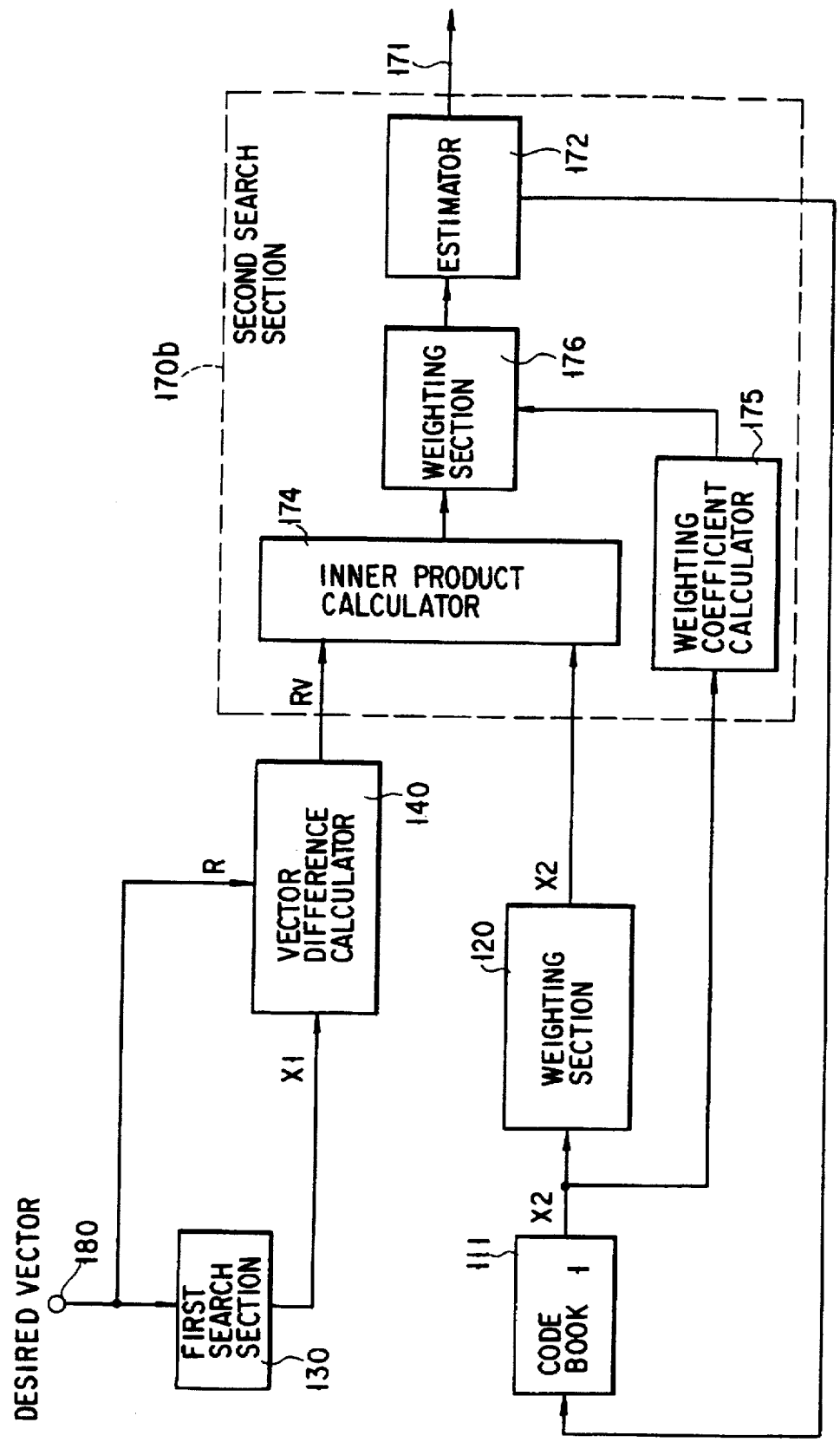
FIG. 10 is a block diagram showing the arrangement of a vector quantizing apparatus according to Embodiment 9.

FIG. 10 shows the configuration of a vector quantizing apparatus according to this embodiment. This embodiment relates to a method of improving the accuracy of the approximate calculation in Embodiment 8. In this embodiment, a weighting coefficient calculator 175 calculates the weighting coefficient based on a code vector, and a weighting section 176 multiplies an inner product, which is calculated by an inner product calculator 174, by this weighting coefficient. The consequent value is used as an estimation value. One practical example usable as the weighting coefficient is the reciprocal of the power of a code vector.

This embodiment has an advantage of improving the approximation accuracy, although the computational cost slightly increases compared to that in Embodiment 8. Note that the reason why the accuracy is improved and other examples of the weighting coefficient are described in Japanese Patent Application No. 6-65265.

(EMBODIMENT 10)

FIG. 11 illustrates the arrangement of a vector quantizing apparatus according to this embodiment. This embodiment relates to the processing of a codebook search section in a CELP coding method which includes an adaptive codebook 211 and a stochastic codebook 212. As previously described, in general, an optimum code vector is selected from the adaptive codebook 211, and then search of the stochastic codebook 212 is performed. In this embodiment, the present invention is applied to the search of the stochastic codebook 212.

Referring to FIG. 11, an input speech to an input terminal 260 is perceptually-weighted by a perceptually-weighting section 240. The influence of the preceding subframe is then subtracted from the input speech to result in a desired vector R. A code vector which generates a synthesized speech vector closest to the desired vector R is searched from the adaptive codebook 211. This code vector is x1, and a synthetic speech vector obtained by passing the code vector x1 through a weighted synthesis filter 230 is X1. A residual vector calculator 140 calculates a residual vector Rv from the synthesized speech vector X1 and the desired vector R in conformity with equation (12) below.

$$Rv = R - \frac{(R, X1)}{|X1|^2} X1 \quad (12)$$

A projection vector calculator 173 outputs $$E = \{(Rv, X2)^2\}/D \quad (13)$$

as the magnitude of a projection vector. Note that $$D = |X1|^2 * |X2|^2 - (X1, X2)^2 \quad (14)$$

where X2 is a synthesized speech vector obtained by passing a candidate x2 of the stochastic codebook 212 through the weighted synthesis filter 230.

An estimator 172 searches x2 by which the value of E is maximized from the stochastic codebook 212 and outputs the search result, 171.

In this embodiment, the desired vector and the code vector of the adaptive codebook 211 are determined before the search. For this reason, the search can be performed by calculating the residual vector Rv once prior to starting the search, and calculating equation (13) by using X2 without any change during the search of the stochastic codebook 212. The result has an advantage in a reduction in computational cost especially when this embodiment is combined with the pre-selection method, in comparison with orthogonal search in which search is performed while orthogonalizing X2.

Note that the values of gains given by gain circuits 221 and 222 can be 1 during the search, since these values are usually determined after the code vector is obtained.

Note also that the codebooks are not restricted to an adaptive codebook and a stochastic codebook. As an example, a combination of two stochastic codebooks can also be used. It, therefore, should be noted that the present invention is applicable regardless of the type, configuration, or number of codebooks. This is also true for the following embodiments.

(EMBODIMENT 11)

FIG. 12 shows the configuration of a vector quantizing apparatus according to this embodiment. In this embodiment, a residual vector calculated in the same fashion as in Embodiment 10 is converted into Rv' by a backward filtering section 260. An inner product calculator 174 outputs the square of the inner product of Rv' and a code vector x2 from a stochastic codebook 212, $$E = (Rv', x2)^2 \quad (15)$$

as an estimation value. An estimator 172 searches a code vector which increases E, from the stochastic codebook 212 and outputs a search result 171. There will now be explained a first method of obtaining Rv', using a relationship indicated by equation (16).

$$(Rv, X2) = Rv' \cdot H \; x2 = Rv' H \cdot x2 = (R' v, x2) \quad (16)$$

where H is the impulse response matrix of a weighted synthesis filter. The vector Rv' is obtained by concretely calculating the impulse response matrix H and multiplying H by Rv from the left side. Since a conventional convolution performs multiplying from the right side, the calculation for obtaining the vector Rv' differs from the convectional convolution.

A second method of obtaining the vector Rv' includes arranging the elements of the vector Rv in reverse order and rearranging the results obtained by filtering the vector Rv in normal order. This second method provides the same Rv' as that in the first method, but an amount of calculations is lower than that in the first method if the order of the weighted synthesis filter is small.

The third method of obtaining the vector Rv' is a method of using an impulse response interrupted in a predetermined length by H in the first method. Since the first method do not interrupt the impulse response, the result of the third method differs from that of the first method but the approximate value can be obtained by a small amount of calculations.

The other method of obtaining the vector Rv' may be applied for another embodiment as well as the above embodiments.

This embodiment has an advantage in that the computational cost can be further reduced compared with that in Embodiment 10 by performing the approximate estimation assuming that the dominator of equation (13) is constant, and by the use of the backward filtering process. Note, however, that the method of this embodiment is an approximate calculation, so, in order to search optimum candidates, the method is in many instances used as a pre-selector, as will be described later in Embodiment 13. Note also that the backward filtering can be used in the numerator calculation in Embodiment 10.

(EMBODIMENT 12)

Figure 13:
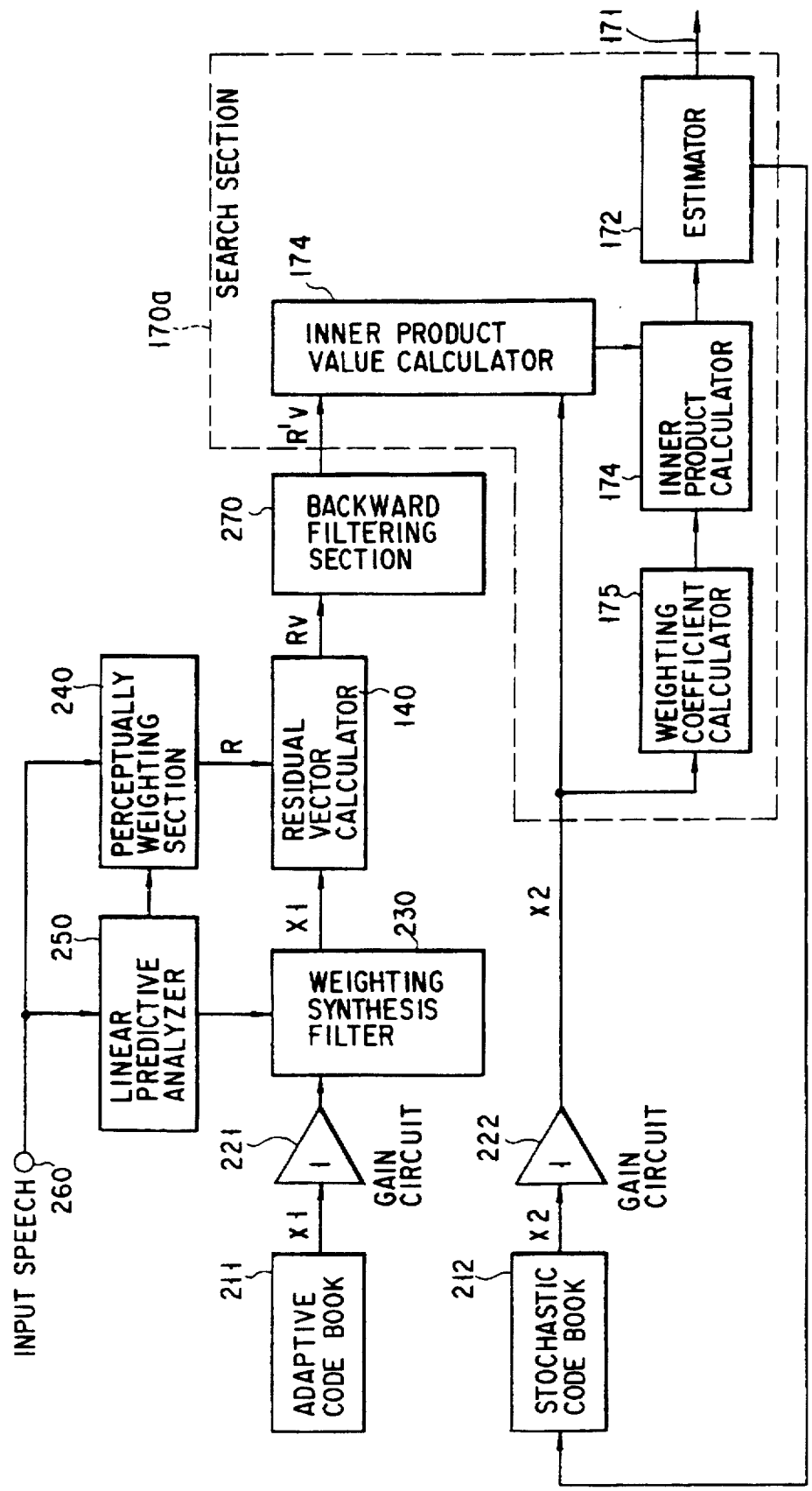
FIG. 13 is a block diagram showing the arrangement of a vector quantizing apparatus according to Embodiment 12.

FIG. 13 illustrates the arrangement of a vector quantizing apparatus according to this embodiment. This embodiment aims to improve the accuracy of approximation. In this embodiment, an inner product calculated in the same way as in Embodiment 11 is multiplied, by a weighting section 176, by the reciprocal of the square of a code vector x2 calculated as a weighting coefficient by a weighting coefficient calculator 175. The resulting value, $$E=(Rv', x2)^2/|x2|^2 \quad (17)$$

is used as an estimation value to search a stochastic codebook 212. This method has an advantage of improving the accuracy of the approximate calculation, although the computational cost is slightly increased from that in Embodiment 11. The reason for the improvement in the accuracy and other examples of the weighting coefficient are described in Japanese Patent Application No. 6-65265.

(EMBODIMENT 13)

Figure 14:
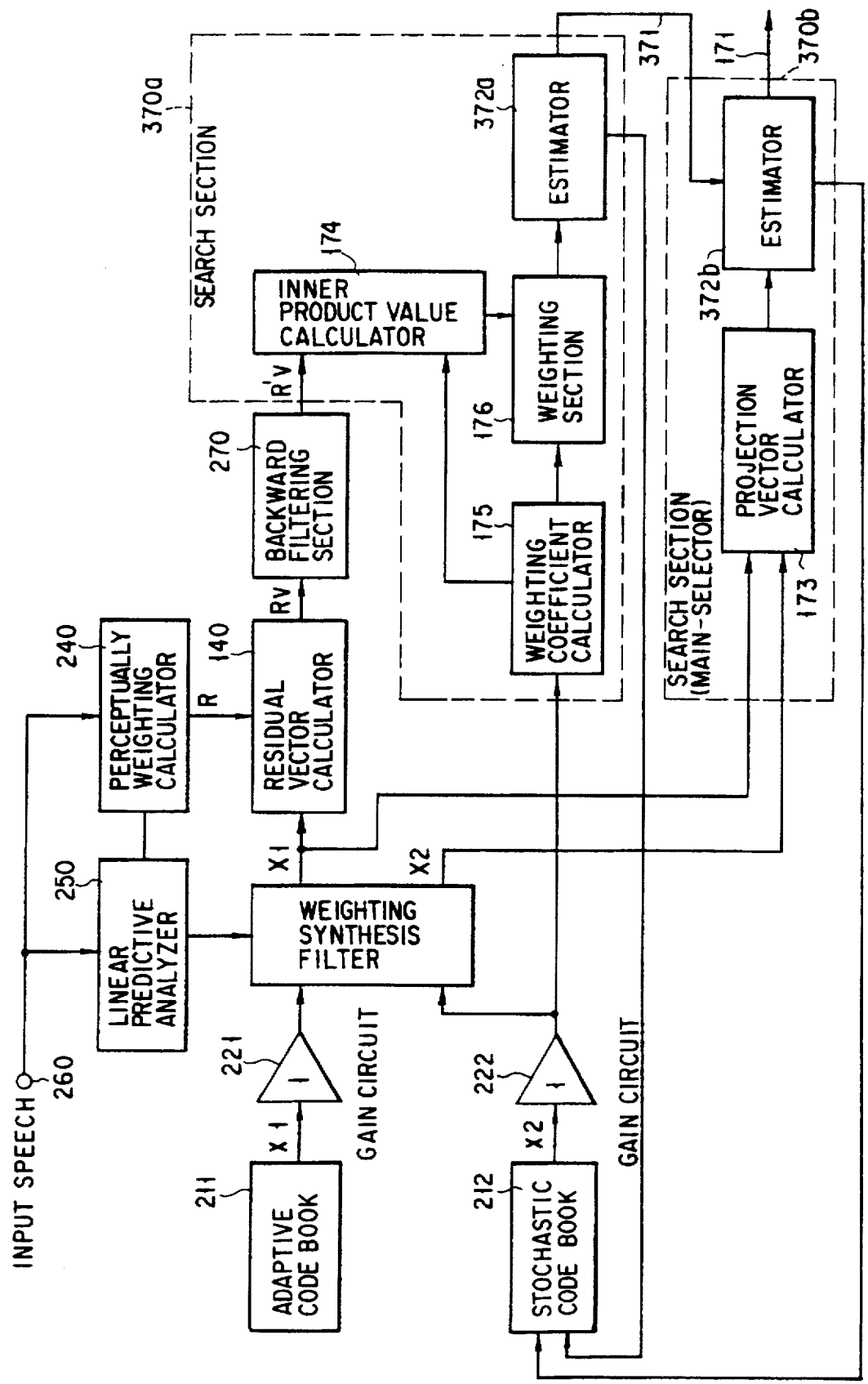
FIG. 14 is a block diagram showing the arrangement of a vector quantizing apparatus according to Embodiment 13.

FIG. 14 shows the arrangement of a vector quantizing apparatus according to this embodiment. This embodiment uses the search section of Embodiment 12 as a pre-selector 370a, and the search section of Embodiment 10 as a main-selector 370b. The estimate expression of Embodiment 10 requires a considerable cost in the calculation of a denominator, particularly the calculation of $|X2|^2$, because, in order to obtain X2, it is necessary to convolute a candidate x2 in the search loop by using the weighted synthesis filter, and no backward filtering process can be used in the calculation of $|X2|^2$.

In this embodiment, therefore, several candidates x2 by which an estimate expression is maximized are chosen by the approximate calculation done by the pre-selector 370a. The indices of these candidates x2 and the value of the numerator in the estimate expression used in the pre-selection are transferred as pre-selected candidates 371 to the main-selector 370b. The main-selector 370b calculates the value of the denominator for each transferred pre-selected candidate, thereby constituting an estimate expression for main selection. The main-selector 370b then searches a candidate by which this estimate expression is maximized and outputs information indicating this optimum candidate x2 as a search result 171.

The configuration of this embodiment has the merits of both Embodiments 12 and 10; that is, a better candidate can be chosen with a smaller amount of calculations. Note that the construction of Embodiment 11 or some other embodiment, rather than that of Embodiment 12, can also be used as the pre-selector.

(EMBODIMENT 14)

In this embodiment if a stochastic codebook 212 has a VSELP structure in Embodiment 10 illustrated in FIG. 11, only the computational cost is decreased on the basis of the present invention without changing the performance. By convention, a synthesized speech vector obtained by convoluting each basis vector by using a weighted synthesis filter is orthogonalized with respect to a candidate X1 of an adaptive codebook. Thereafter, an estimate expression corresponding to equation (2) is recurrently calculated to determine the code of the basis vector.

In contrast, in the present invention, a residual vector Rv is calculated by orthogonalizing a desired vector without orthogonalizing the response of a basis vector. Thereafter, an estimate expression corresponding to equation (10) is recurrently calculated. The result is an advantage in that the code of a basis vector can be determined with a small computational cost. Also, use of the combination of the pre-selection and the main selection described in Embodiment 13 brings about another advantage in that a nearly optimum code is determined by a smaller computational cost.

(EMBODIMENT 15)

FIG. 15 shows the arrangement of a vector quantizing apparatus according to this embodiment. In this embodiment, the present invention is applied to a CELP speech coding method; that is, a desired vector R(0) which is obtained by perceptually-weighting an input speech by a perceptually-weighting section is subjected to multistage vector quantization. A first search block 1421 is applied with, as initial values, a zero vector, as P(0), and an empty set, as B(0). These initial values are merely conceptional and are therefore not at all applied in some cases. An input speech to a terminal 1401 is processed into the initial value R(0) of a residual vector by a perceptually-weighting section 1410. Parameters analyzed by a linear predictive analyzer 1430 are given to a weighting section 1030 of each of search blocks 1421 to 1423, thereby constituting a weighting synthesis filter. Each of these search blocks 1421 to 1423 is constituted by the vector quantizing apparatus of Embodiment 4, for example.

Figure 16:
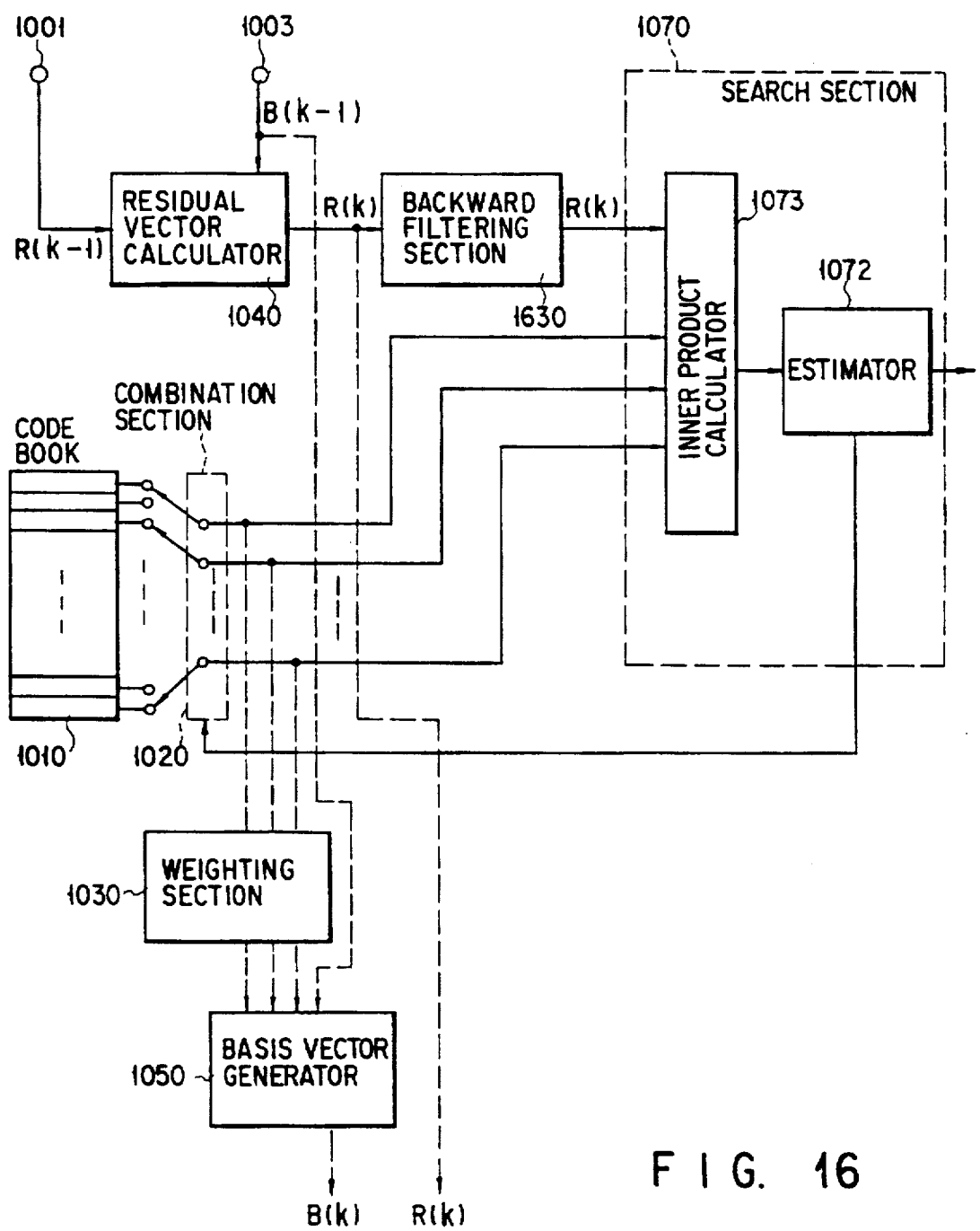
FIG. 16 is a block diagram showing the arrangement in which a backward filtering is used in Embodiment 1.
Figure 17:
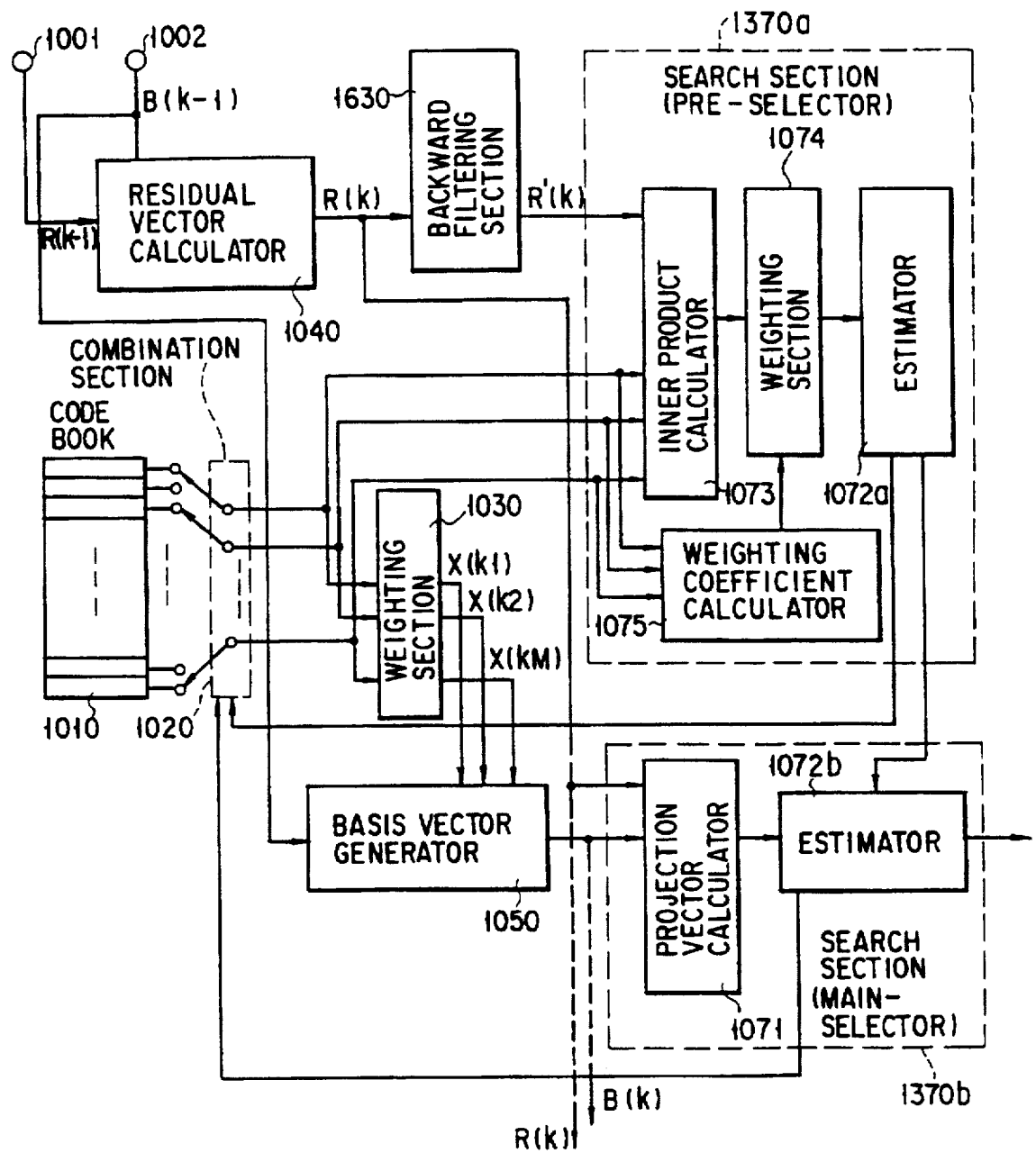
FIG. 17 is a block diagram showing the arrangement in which a backward filtering is used in Embodiment 3.

As already mentioned earlier, in the CELP speech coding method, the computational cost in a weighted synthesis filter is often decreased by the use of a backward filtering processing. As examples, FIGS. 16 and 17 illustrate systems in which the backward filtering is applied to Embodiments 1 and 3, respectively. If a system includes a Weighted synthesis filter, however, the computational cost can be decreased in any embodiment other than Embodiments 1 and 3, by performing similar processing.

The configuration of a backward filtering section 1630 itself is nearly identical with that of the weighted synthesis filter except that input vectors are filtered in the reverse order to the input order, the obtained vectors are inverted and output again, and vectors equivalent to these output vectors are output. When the backward filtering is to be used, the parameters input from the linear predictive analyzer to the search blocks 1421 to 1423 are transferred to the backward filtering section 1630.

In addition to the method described above, a method by which the difference between a desired vector and its approximate vector is obtained is also usable as the method of calculating a residual vector. This method will be described below.

FIG. 18 illustrates only a portion in which a second residual vector R(k) is calculated. FIG. 19 is a modification of FIG. 18. That is, calculating the difference between a first residual vector R(k-1) and its projection vector is equivalent to calculating a desired vector R(0) and its projection vector Q(k-1). An intuitive explanation of the reason is given with reference to FIG. 8 which illustrates an example of two-stage search. In FIG. 8, a dotted line R–Rp indicates the difference between a desired vector and its projection vector. This is equivalent to the difference Rv–Rvp of a residual vector and its projection vector. Consequently, the two vectors are the same.

An arrangement shown in FIG. 20 is made feasible by applying this fact to this embodiment. Note that the structure shown in FIG. 18 which is included in the search block is replaced with the structure shown in FIG. 19, so input/output parameters are changed to a desired vector R(0) and an approximate vector Q(k). This arrangement is essentially identical with that shown in FIG. 15, and some other configuration is also possible. In addition, this is true not only for the CELP speech coding method but for general multistage vector quantization.

(EMBODIMENT 16)

Figure 21:
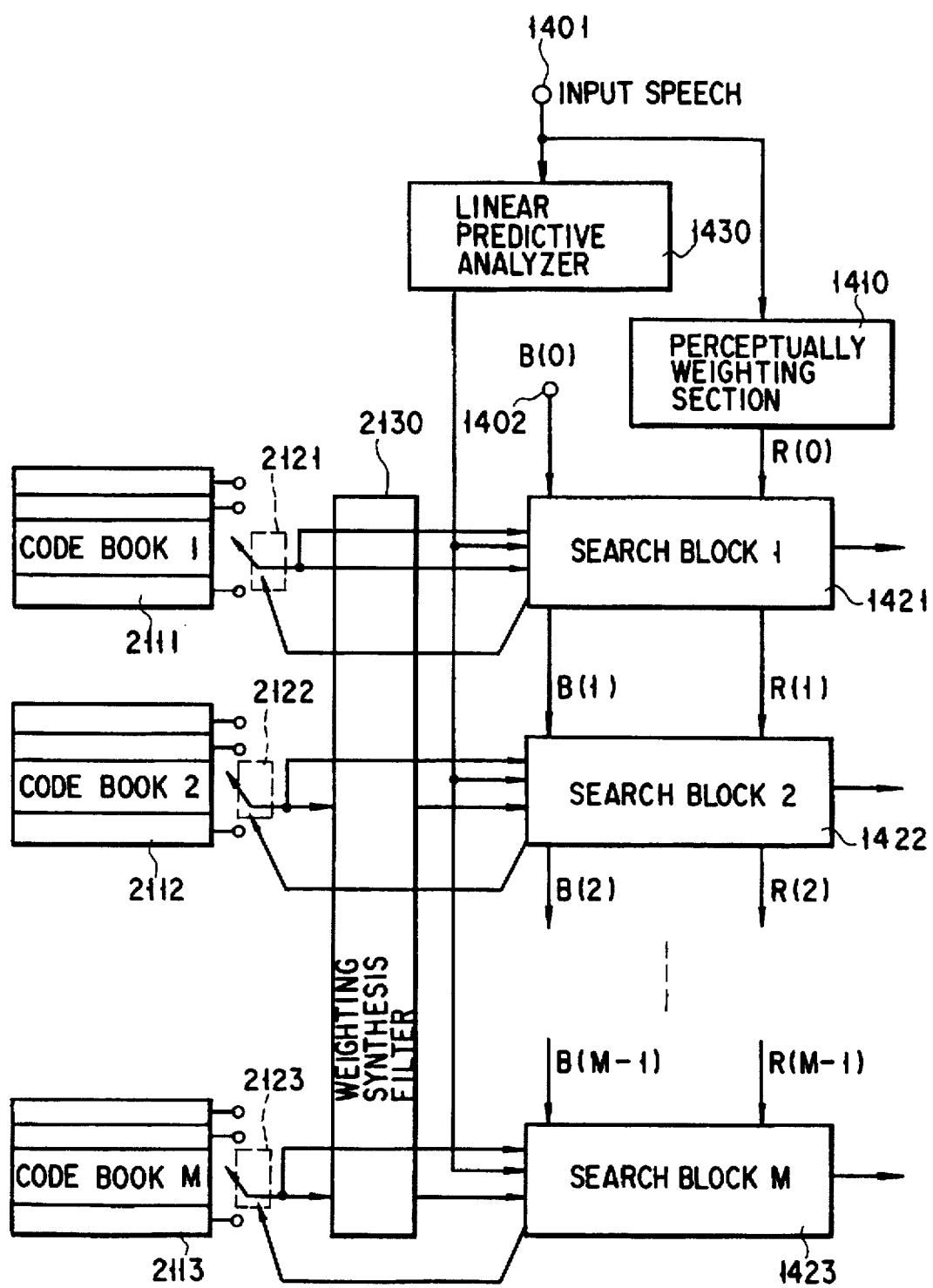
FIG. 21 is a block diagram showing the arrangement of a vector quantizing apparatus according to Embodiment 16.

FIG. 21 shows the configuration of a vector quantizing apparatus according to this embodiment. This embodiment shows one practical example of the configuration most often used in the CELP speech coding method. That is, a weighted synthesis filter 2130 which corresponds to a weighting section is used as a common filter in a series of search operations. Each of search blocks 1421 to 1423 searches one code vector from a corresponding one of codebooks 2111 to 2113.

Figure 22:
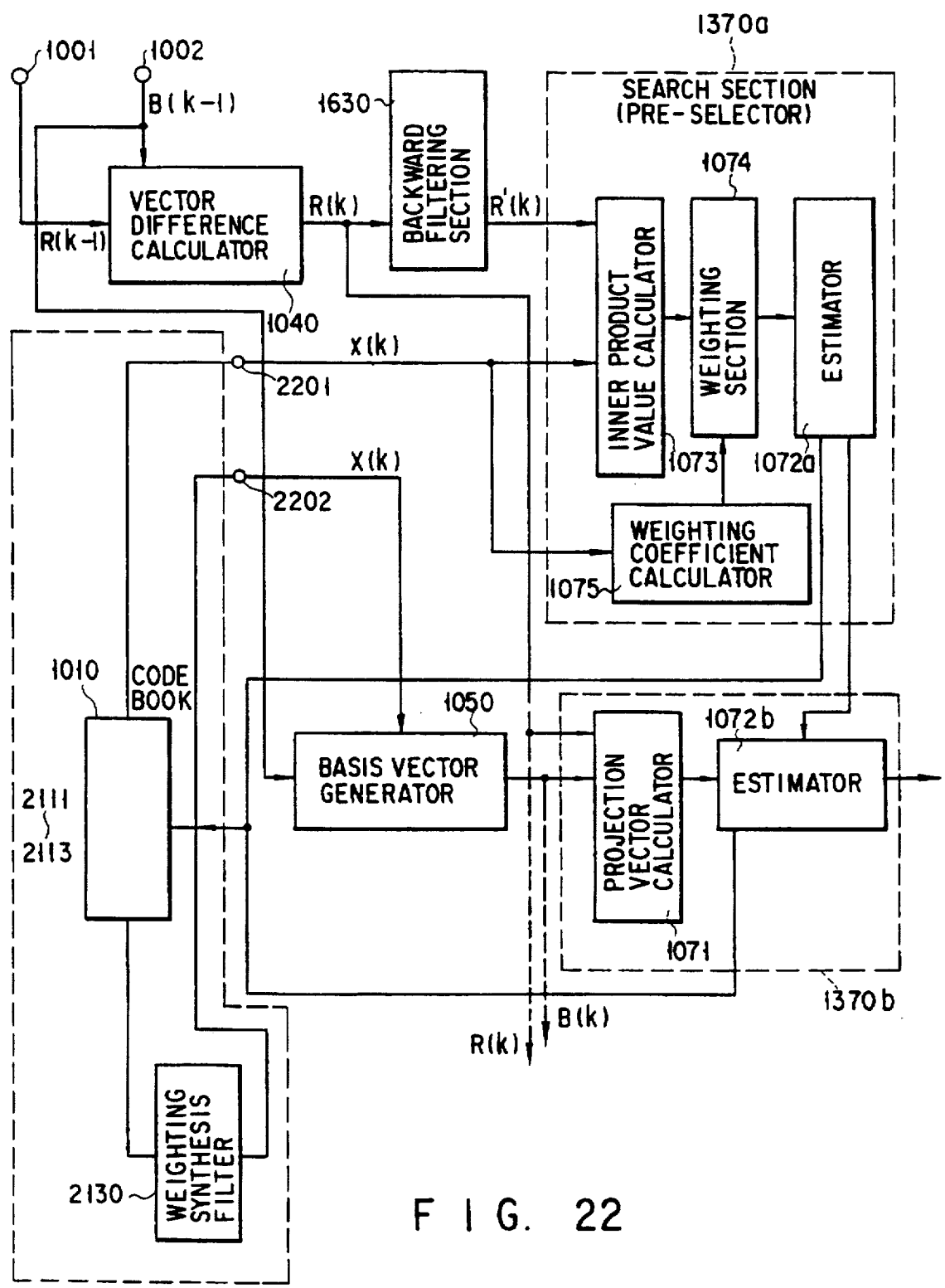
FIG. 22 is a block diagram showing a practical example of the arrangement of a search block in FIG. 21.

FIG. 22 illustrates an example of the arrangement of the search block of this embodiment. Referring to FIG. 22, the computational cost is efficiently reduced by using a backward filtering and a pre-selection method. This configuration is essentially the same as that of Embodiment 4 except that codebooks 2111 to 2113 and a weighted synthesis filter 2130 are provided externally to the arrangement, a backward filtering section 1630 is additionally provided, and only one code vector is to be searched. By making similar alterations, other embodiments can also be applied to the search block of this embodiment. Note that if the backward filtering is not used, any code vector need not be directly input to the search block whereby the terminal 2201 is not required.

The gist of the present invention explained above on the basis of several embodiments is as follows.

Figure 8:
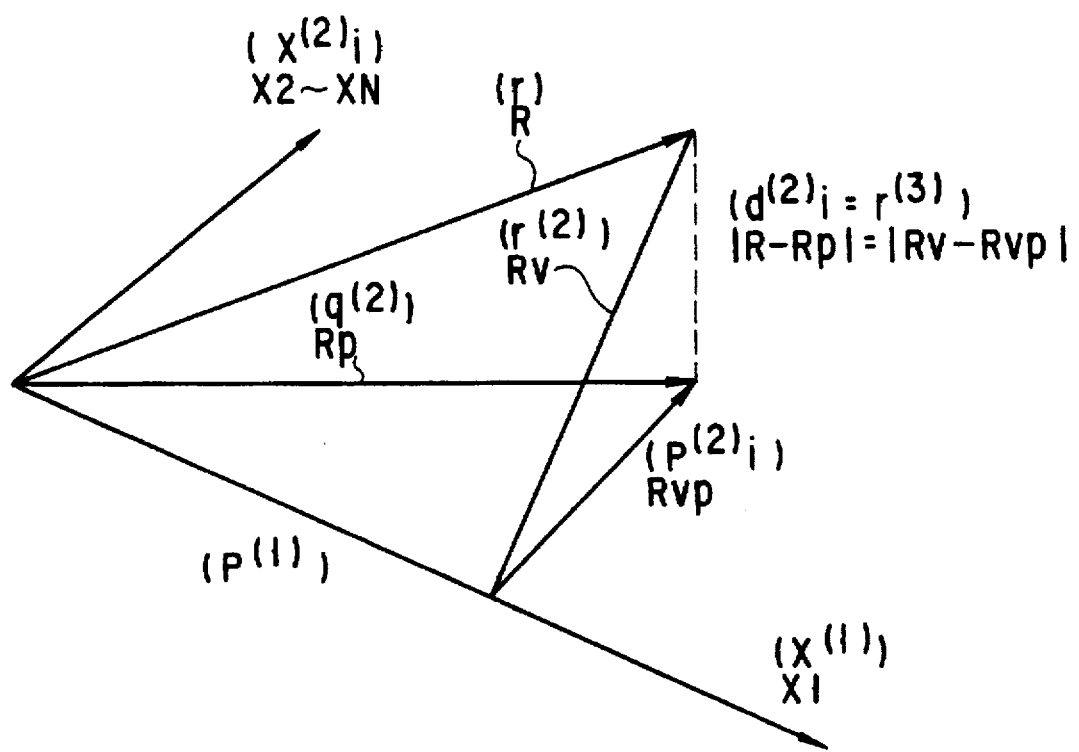
FIG. 8 is a view showing projection vectors.

That is, according to the present invention, a residual vector $r^{(2)}$ in FIG. 8 is calculated using an optimum gain prior to starting the second-stage search. In the second-stage search, a projection vector $p^{(2)}i$ of $r^{(2)}$ with respect to the plane formed by $x^{(1)}$ and $x^{(2)}i$ is calculated, and a code vector which maximizes the magnitude of $p^{(2)}i$ is searched. Similar processing is done in the search in the third and subsequent stages. In the kth-stage search, a residual vector $r^{(k)}$ is previously obtained, and the search loop searches a code vector $c^{(k)}$ which maximizes the magnitude of a vector $p^{(k)}i$ obtained by projecting $r^{(k)}$ in the vector space formed by the code vectors $x^{(1)}, \ldots, x^{(k-1)}$ that are obtained in the search up to the (k-1)th stage.

$$|p^{(k)}i|^2 = \frac{<r^{(k)},x^{(k)}i>^2}{|x^{(k)}i|^2 - \sum_{j=1}^{k-1} <p^{(j)},x^{(k)}i>^2/|p^{(j)}i|^2}$$

The above non-orthogonal search provides the same result as the conventional orthogonal search, although the search makes use of a residual vector. This is so because, in a right triangle consisting of $r^{(2)}$, $p^{(2)}i$, and $d^{(2)}$, the minimum value of $|d^{(2)}|$ is equivalent to the maximum value of $|p(2)i|$, since the oblique side $r^{(2)}$ is fixed. Also, the calculation of a residual vector corresponding to orthogonalization can be performed outside the search loop. When the pre-selection method is employed, therefore, the computational cost can be largely reduced compared to the orthogonal search. This is more specifically illustrated in the following table.

|  | Orthogonal search | Non-orthogonal search |
| --- | --- | --- |
| Numerator | K (n + 1) | N + 1 |
| All of Estimation equation | (P + k) N + 3k − 1 | (P + k) N + 2k |

In the above table, N and P are the sample number of a subframe and the order of the weighted synthesis filter, respectively. In the calculation of the computational cost, addition and subtraction, multiplication, and a product-sum calculation are considered as one calculation. The calculation of a numerator is based on the assumption that an inner product is calculated by the use of a backward filtering without convoluting a code vector.

In the above table, the computational costs of the overall estimate expressions of the two methods are almost identical. However, the computational cost of a numerator in the non-orthogonal search is 1/k of that in the orthogonal search.

FIG. 26 shows the comparison of the computational cost of the conventional orthogonal search with that of the non-orthogonal search of the present invention. Referring to FIG. 26, the computational cost is a cumulative value of calculations including main selection from the second stage to each corresponding stage. The conditions of the CELP method used for the comparison are that N=40 samples (5 msec), P=10, and the pre-selection number is 6. In this method, each stage includes 64 independent code vectors. It is evident from FIG. 26 that in the non-orthogonal search of the present invention the computational cost reducing effect is enhanced as the number of stages increases.

In multistage search, e.g., in performing search by using vectors $x^{(1)}, x^{(2)}, x^{(3)},$ and $x^{(4)}$, the vector $x^{(1)}$ is first searched for and fixed. Next, the vector $x^{(2)}i$ by which a projection vector is maximized is determined from $x^{(1)}$ and $x^{(2)}i$ alone, and this $x^{(2)}i$ is fixed for $x^{(2)}$. Subsequently, while changing $x^{(3)}i$, $x^{(3)}i$ which maximizes a projection vector is determined from the fixed $x^{(1)}$, $x^{(2)}$, $x^{(3)}i$, and this $x^{(3)}i$ is also fixed. In this manner, an optimum vector is searched while the vectors $x^{(1)}$ to $x^{(4)}$ in the table are sequentially fixed. That is, a second basis vector is obtained while updating a first basis vector, and thereby an optimum code vector is searched. This searching method increases the speed of the search processing compared to that in a method in which an optimum vector is searched while changing both of two vectors.

As has been described above, according to the present invention, the search for an optimum code vector is performed by using a residual vector. Since this obviates the need for orthogonalization for code vectors in the search loop, an optimum code vector can be searched with a smaller computational cost than in the conventional orthogonal search. This effect of reducing the computational cost is especially notable in a multistage vector quantizing apparatus.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A vector quantizing apparatus comprising:
   means for receiving a set of first basis vectors corresponding to a pre-stage output;
   means for receiving a target vector;
   means for calculating an approximate vector approximate to a target on the basis of the set of first basis vectors and the target, and calculating a residual vector corresponding to a difference between the target vector and the approximate vector;
   code vector means for outputting a set of code vectors;
   selecting means for selecting at least one code vector from the set of code vectors;
   means for producing a set of second basis vectors on the basis of the code vector selected by said selecting means and the set of first basis vectors;
   searching means for searching, from the set of code vectors, for the code vectors which allow to increase a magnitude of a projection vector obtained by projecting the residual vector in a vector space formed by the set of second basis vectors; and
   means for outputting information specifying the code vectors searched by said searching means.

2. An apparatus according to claim 1, wherein said searching means comprises:
   projection vector means for receiving the set of second basis vectors and the residual vector and calculating a combination of code vectors which allows to increase the magnitude of the projection vector obtained by projecting the residual vector in the vector space formed by the second basis vectors; and
   estimating means for searching, from the set of code vectors, for a code vector by which the projection vector is maximized.

3. An apparatus according to claim 1, further comprising:
   weighting means for weighting the code vector selected from the set of code vectors, and
   wherein said means for obtaining a set of second basis vectors calculates the second basis vectors from the weighted code vector and the set of first basis vectors.

4. An apparatus according to claim 3, wherein said searching means comprises:
   projection vector means for receiving the set of second basis vectors and the residual vector and calculating the code vectors which allow to increase the magnitude of the projection vector obtained by projecting the residual vector in a vector space formed by the second basis vectors; and
   estimating means for searching for a code vector by which the projection vector is maximized.

5. An apparatus according to claim 3, wherein said searching means has a codebook which stores a large number of code vectors and means for searching for an optimum code vector from said codebook.

6. A vector quantizing apparatus according to claim 1, which includes pre-selecting means for selecting, from the set of code vectors, code vectors which allow to increase the magnitude of an estimation value increasing the projection vector.

7. A vector quantizing apparatus according to claim 6, wherein said pre-selecting means selects a code vector which allows to increase the magnitude of an estimation value based on an inner product of the code vector selected by said selecting means and the residual vector.

8. A vector quantizing apparatus comprising:
   means for receiving a set of first basis vectors corresponding to a pre-stage output;
   means for receiving a target vector;
   means for calculating an approximate vector approximate to a target on the basis of the set of first basis vectors and the target, and calculating a residual vector corresponding to a difference between the target vector and the approximate vector;
   code vector means for outputting a set of code vectors;
   selecting means for selecting at least one code vector from the set of code vectors;
   searching means for searching, from the set of code vectors, for at least one code vector which allows a maximization of an estimation value corresponding to an inner product of the code vector selected by said selecting means and the residual vector; and
   means for outputting information specifying the code vector searched by said searching means.

9. An apparatus according to claim 8, wherein said searching means comprises:
   inner product calculating means for calculating the inner product of the residual vector and the selected code vector; and
   searching means for searching, from the set of code vectors, for the code vector by which the estimation value based an the inner product is maximized.

10. An apparatus according to claim 9, further comprising weighting means for weighting the code vector, and wherein said inner product calculating means calculates an inner product of the weighted code vector and the residual vector.

11. An apparatus according to claim 8, wherein said searching means searches for a code vector which allows a maximization of the inner product of the code vector and the residual vector.

12. A vector quantizing apparatus comprising:
   means for receiving a set of first basis vectors corresponding to a pre-stage output;
   means for receiving a target vector;
   means for calculating an approximate vector approximate to a target on the basis of the set of first basis vectors and the target, and calculating a residual vector corresponding to a difference between the target vector and the approximate vector;
   code vector means for outputting set of code vectors;
   selecting means for 1 at least one code vector from the set of code vectors;
   first searching means for searching, from the set of code vectors, as pre-selected candidates, a plurality of code vectors which allows an increase of an estimation value based on an inner product of the code vector selected by said selecting means and the residual vector;

means for producing a set of second basis vectors on the basis of the code vectors selected as the preselected candidates by said first searching means and the set of first basis vectors;

second searching means for searching, from the set of code vectors, for an optimum code vector which allows an increase of a projection vector obtained by projecting the residual vector in a vector space formed by the set of second basis vectors; and means for outputting information specifying the optimum code vector.

13. An apparatus according to claim 12, wherein said first searching means comprises:

inner product calculating means for calculating the inner product of the residual vector and the code vector; and searching means for searching for the code vector which allows an increase of the estimation value based on the inner product.

14. An apparatus according to claim 12, further comprising weighting means for weighting the code vector selected from the set of code vectors, and wherein said first searching means selects a plurality of weighted code vectors, as pre-selection candidates, from a set of weighted code vectors, and said means for obtaining a set of second basis vectors calculates the second basis vectors from a vector space formed by the weighted code vectors and the set of first basis vectors.

15. An apparatus according to claim 12, wherein said second searching means comprises:

projection vector means for receiving the set of second basis vectors and the residual vector and calculating a code vector which allows an increase of the projection vector obtained by projecting the residual vector in a vector space formed by the second basis vectors; and estimating means for searching for a code vector by which the projection vector is maximized.

16. A vector quantizing apparatus comprising:

means for receiving a set of first basis vectors corresponding to a pre-stage output;

means for receiving a target vector;

means for calculating an approximate vector approximate to a target on the basis of the set of first basis vectors and the target, and calculating a residual vector corresponding to a difference between the target vector and the approximate vector;

code vector means for outputting a set of code vectors;

selecting means for selecting at least one code vector from the set of code vectors;

pre-selecting means for selecting, from a set of code vectors, code code vectors which allow an increase of an estimation value based on an inner product of the code vector selected by said selecting means and the residual vector; and main-selecting means including means for producing a set of second basis vectors on the basis of the code vector selected by said pre-selecting means and the set of first basis vectors, and means for searching, from the set of code vectors, for a code vector which allows to increase a magnitude of a projection vector obtained by projecting the residual vector in a vector space formed by the set of second basis vectors; and means for outputting information specifying the optimum code vector.

17. An apparatus according to claim 16, wherein said main-selecting means includes means for selecting, from the pre-selected candidates, for an optimum code vector which allows a maximization of a value calculated by dividing the inner product used in said pre-selecting means by a magnitude of a code vector orthogonalized in a vector space formed by the set of first basis vectors.

18. An apparatus according to claim 16, wherein said pre-selecting means selects a code vector which allows an increase of a value obtained by weighting the inner product of a code vector and the residual vector with a weighting coefficient based on the code vector.

19. An apparatus according to claim 16, wherein said pre-selecting means comprises means for calculating the inner product by using an inner product of the code vector and a backward filtered vector of the residual vector.

20. A vector quantizing apparatus comprising:

means for receiving a set of first basis vectors corresponding to a pre-stage output;

means for receiving a target vector;

means for calculating an approximate vector approximate to a target on the basis of the set of first basis vectors and the target, and calculating a residual vector corresponding to a difference between the target vector and the approximate vector;

code vector means for outputting a set of code vectors;

selecting means for selecting at least one code vector from the set of code vectors;

searching means for searching, from the set of code vectors, for a code vector which allows a maximization of an estimation value based on an inner product of the code vector selected by said selecting means and the residual vector, said searching means including means for calculating a value corresponding to the inner product by using an inner product obtained by the code vector and a backward filtered vector of the residual vector; and means for outputting information specifying the code vector searched by said searching games.

21. An apparatus according to claim 20, wherein said searching means comprises a plurality of codebooks storing code vectors and a weighted synthesis filter which are provided externally, and a backward filtering section for backward-filtering the residual vector.

22. An apparatus according to claim 20, wherein said searching means comprises a weighting coefficient calculator for calculating the code vector, a weighting section for multiplying the inner product by a weighting coefficient corresponding to the reciprocal of the square of the code vector, to obtain an estimation value by which a stochastic codebook is searched.

23. An apparatus according to claim 20, wherein said searching means comprises a pre-selector for selecting several vector candidates by an approximate calculation and a main-selector for calculating the value of the denominator for each of the pre-selected candidates, thereby constituting an estimate expression for main selection, and then searching for a candidate by which this estimate expression is maximized and outputting information indicating an optimum candidate.

24. An apparatus according to claim 20, which includes backward filtering means for obtaining the backward filtered vector of the residual vector and wherein said searching means comprises means for calculating the inner product from the code vector and the backward filtered vector of the residual vector.

25. An apparatus according claim 20, which includes backward filtering means for obtaining the backward filtered vector of the residual vector and wherein said searching means comprises a pre-selector for selecting several vector candidates by an approximate calculation and a main-selector for searching, from said set of code vectors, the code vector which allows an increase of the projection vector obtained by projecting the residual vector in a vector space formed by the vector candidates and basis vectors.

26. An apparatus according to claim 20, which comprises a plurality of codebooks storing code vectors and a weighted synthesis filter which are provided externally, and a backward filtering section for backward-filtering the residual vector and wherein said searching means comprises a pre-selector for selecting several vector candidates by an approximate calculation and a main-selector for searching, from a set of code vectors of said codebooks, for a code vector which allows an increase of the projection vector obtained by projecting the residual vector in a vector space formed by the vector candidates and basis vectors.

27. A vector quantizing method comprising:
  receiving a set of first basis vectors corresponding to a pre-stage output;
  calculating an approximate vector approximate to a target on the basis of the set of first basis vectors and the target;
  calculating a residual vector corresponding to a difference between the target vector and the approximate vector;
  producing a set of code vectors;
  selecting at least one code vector from the set of code vectors;
  producing a set of second basis vectors on the basis of the at least one code vector selected in said selecting step and the set of first basis vectors;
  searching, from the set of code vectors, for the code vectors which allow to increase a magnitude of a projection vector obtained by projecting the residual vector in a vector space formed by the set of second basis vectors; and
  outputting information specifying the code vector searched by said searching.

28. A vector quantizing method comprising:
  receiving a set of first basis vectors corresponding to a pre-stage output;
  calculating an approximate vector approximate to a target on the basic of the set of first basis vectors and the target;
  calculating a residual vector corresponding to a difference between the target vector and the approximate vector;
  producing a set of code vectors;
  selecting at least one code vector from the set of code vectors;
  searching, from the set of code vectors, for a combination of code vectors which allows a maximization of an estimation value corresponding to an inner product of the code vector selected by said selecting and the residual vector; and
  outputting information specifying the code vector searched.

29. A vector quantizing method comprising:
  receiving a set of first basis vectors corresponding to a pre-stage output;
  calculating an approximate vector approximate to a target on the basis of the set of first basis vectors and the target;
  calculating a residual vector corresponding to a difference between the target vector and the approximate vector;
  producing a set of code vectors;
  selecting at least one code vector from the set of code vectors;
  searching, from the set of code vectors, as preselected candidates, for a plurality of code vectors which allows an increase of an estimation value based on an inner product of the code vector selected by said selecting and the residual vector;
  producing a set of second basis vectors on the basis of the code vectors selected as the pre-selected candidates by said searching and the set of first basis vectors;
  searching, from the set of code vectors, for an optimum code vector which allows to increase a magnitude of a projection vector obtained by projecting the residual vector in a vector space formed by the set of second basis vectors; and
  outputting information specifying the optimum code vector.

30. A vector quantizing method comprising:
  receiving a set of first basis vectors corresponding to a pre-stage output;
  calculating an approximate vector approximate to a target on the basis of the set of first basis vectors and the target, and calculating a residual vector corresponding to a difference between the target vector and the approximate vector;
  outputting a set of code vectors;
  selecting at least one code vector from the set of code vectors;
  searching, from a set of code vectors, at least one code vector which allows an increase of an estimation value based on an inner product of the code vector selected by said selecting and the residual vector; and
  producing a set of second basis vectors on the basis of the code vector selected by said selecting and the set of first basis vectors and searching, from the set of code vectors, for a code vector which allows to increase a magnitude of a projection vector obtained by projecting the residual vector in a vector space formed by the set of second basis vectors; and outputting information specifying the optimum code vector.

31. A vector quantizing method comprising:
  receiving a set of first basis vectors corresponding to a pre-stage output;
  calculating an approximate vector approximate to a target on the basis of the set of first basis vectors and the target, and calculating a residual vector corresponding to a difference between the target vector and the approximate vector;
  producing a set of code vectors;
  selecting at least one code vector from the set of code vectors;
  searching, from the set of code vectors, for a code vector which allows a maximization of an estimation value based on an inner product of the code vector selected by said selecting and the residual vector, said searching including calculating a value corresponding to the inner product by using an inner product obtained by the code vector and a backward filtered vector of the residual vector; and
  outputting information specifying the code vector searched by said searching.

* * * * *